US012692576B2

(12) United States Patent
Mitoma et al.

(10) Patent No.: US 12,692,576 B2
(45) Date of Patent: Jul. 28, 2026

(54) ALUMINUM BONDING WIRE FOR POWER SEMICONDUCTOR

(71) Applicants: TANAKA ELECTRONICS Co., Ltd., Saga (JP); MITSUBISHI ELECTRIC CORPORATION, Tokyo (JP)

(72) Inventors: Shuichi Mitoma, Saga (JP); Tsukasa Ichikawa, Saga (JP); Tsuyoshi Uraji, Tokyo (JP); Tatsunori Yanagimoto, Tokyo (JP); Dai Nakajima, Tokyo (JP)

(73) Assignees: TANAKA ELECTRONICS Co., Ltd., Saga (JP); MITSUBISHI ELECTRIC CORPORATION, Tokyo (JP)

( * ) Notice: Subject to any disclaimer, the term of this patent is extended or adjusted under 35 U.S.C. 154(b) by 267 days.

(21) Appl. No.: 18/263,000

(22) PCT Filed: Jan. 25, 2022

(86) PCT No.: PCT/JP2022/002523
§ 371 (c)(1),
(2) Date: Jul. 26, 2023

(87) PCT Pub. No.: WO2022/163606
PCT Pub. Date: Aug. 4, 2022

(65) Prior Publication Data
US 2024/0105667 A1       Mar. 28, 2024

(30) Foreign Application Priority Data
Jan. 28, 2021     (JP) ................................. 2021-011625

(51) Int. Cl.
*C22C 21/00*       (2006.01)
*C22F 1/00*       (2006.01)
(Continued)

(52) U.S. Cl.
CPC .............. *C22C 21/00* (2013.01); *C22F 1/002* (2013.01); *C22F 1/04* (2013.01);
(Continued)

(58) Field of Classification Search
CPC .. H10D 86/60; H10D 86/0212; H10D 86/441; C22C 21/00; C22F 1/002;
(Continued)

(56) References Cited

U.S. PATENT DOCUMENTS 3,353,073 A * 11/1967 Tsutomu ................. H01L 24/05
257/E23.184
2006/0056213 A1    3/2006 Lee et al.
(Continued)

FOREIGN PATENT DOCUMENTS

JO         2014129578 A * 7/2014 ............. H01L 23/49
JP         2011-252185 A    12/2011
(Continued)

OTHER PUBLICATIONS

Translation of JP 2014129578 (Year: 2014).*
(Continued)

*Primary Examiner* — Jami Valentine Miller
(74) *Attorney, Agent, or Firm* — Maier & Maier, PLLC

(57) ABSTRACT

An aluminum wire with which, at the time of bonding a bonding wire for a power semiconductor, the wire is not detached from a wedge tool, and a long life is achieved in a power cycle test. The aluminum wire is made of an aluminum alloy having an aluminum purity of 99 mass % or more and contains, relative to a total amount of all elements of the aluminum alloy, a total of 0.01 mass % or more and 1 mass % or less of iron and silicon. In a lateral cross-section in a direction perpendicular to a wire axis of the aluminum wire, an orientation index of is 1 or more, an orientation
(Continued)

index of is 1 or less, and an area ratio of precipitated particles is in a range of 0.02% or more to 2% or less.

13 Claims, 7 Drawing Sheets

(51) Int. Cl.
| | |
|---|---|
| *C22F 1/04* | (2006.01) |
| *H10W 72/00* | (2026.01) |
| *H10W 72/30* | (2026.01) |
| *H10W 72/50* | (2026.01) |
| *H10W 72/90* | (2026.01) |
| *H10W 90/00* | (2026.01) |

(52) U.S. Cl.
CPC ................ *H10W 72/07533* (2026.01); *H10W 72/07552* (2026.01); *H10W 72/352* (2026.01); *H10W 72/521* (2026.01); *H10W 72/552* (2026.01); *H10W 72/5524* (2026.01); *H10W 72/884* (2026.01); *H10W 72/90* (2026.01); *H10W 72/923* (2026.01); *H10W 72/944* (2026.01); *H10W 72/952* (2026.01); *H10W 90/734* (2026.01); *H10W 90/736* (2026.01); *H10W 90/753* (2026.01); *H10W 90/754* (2026.01); *H10W 90/756* (2026.01)

(58) Field of Classification Search
CPC . C22F 1/04; H01L 24/45; H01L 24/05; H01L 24/48; H01L 24/06
USPC .......................................................... 257/59
See application file for complete search history.

(56) References Cited

U.S. PATENT DOCUMENTS

| | | | | |
|---|---|---|---|---|
| 2011/0298121 | A1 | 12/2011 | Nishibori et al. | |
| 2017/0154699 | A1* | 6/2017 | Kang .................... | H01B 1/023 |
| 2020/0283875 | A1* | 9/2020 | Vo ........................... | B60L 50/64 |

FOREIGN PATENT DOCUMENTS

| | | | |
|---|---|---|---|
| JP | 2013-258324 | A | 12/2013 |
| JP | 2014-129578 | A | 7/2014 |
| JP | 2020-059886 | A | 4/2020 |
| KR | 1020140086797 | A | 7/2014 |
| TW | 201327694 | A | 7/2013 |
| WO | 2013180300 | A1 | 12/2013 |
| WO | 2019/188452 | A1 | 10/2019 |
| WO | 2020/184655 | A1 | 9/2020 |

OTHER PUBLICATIONS

Office Action issued on Feb. 27, 2025, in corresponding Korean Application No. 10-2023-7022966, 12 pages.
Office Action issued on Apr. 16, 2024, in corresponding Taiwanese Application No. 111103471, 11 pages.
Office Action issued on Aug. 20, 2024, in corresponding Japanese Application No. 2022-578387, 8 pages.
International Search Report issued on Mar. 15, 2022 in corresponding application No. PCT/JP2022/002523; 5 pages.
Office Action issued on Apr. 15, 2026, in corresponding Chinese Application No. 202280011513.5, 14 pages.

* cited by examiner

ALUMINUM BONDING WIRE FOR POWER SEMICONDUCTOR

FIELD

The present invention relates to an aluminum bonding wire for a power semiconductor (hereinafter referred to as an "aluminum wire").

BACKGROUND

"Semiconductor" is typically a generic term for CPUs (central processing units), memories, and the like, which mainly act as "calculation", "storage", and the like. Semiconductors are used for, for example, consumer equipment such as PCs (personal computers), smart phones, and televisions. On the other hand, power semiconductors perform driving motors, charging batteries, and supplying power for operating microcomputers and LSIs (large scale integrated circuits). Power semiconductors are mainly used for changing voltage and frequency, power conversion (converting direct current to alternating current or alternating current to direct current), and the like. Power semiconductors include power transistors and the like. "Power module" often refers to a component in which a circuit that performs power supply is integrated, and this circuit is typically configured by combining a plurality of ICs (integrated circuits) including power semiconductors. Power semiconductors are also called power semiconductors, power devices, power elements, power semiconductor elements, or the like.

"Inverters" installed in energy saving (hereinafter also referred to as "energy saving") household appliances such as air conditioners, refrigerators, and washing machines are familiar examples of the use of the power semiconductors. The inverter controls the rotation speed of the motor by converting the frequency. By freely changing the rotation speed of the motor, the inverter can reduce unnecessary movement of the motor, contributing to energy saving. On the other hand, non-inverter air conditioners (air conditioners) adjust room temperature by repeatedly starting and stopping the motor, which thus may cause problems such as lack of temperature stability and high power consumption. These functions of the inverter are realized by "switching" in which the power transistor turns the current on and off finely.

In addition to the energy saving home appliances, power semiconductors are widely used, for example, in the field of transportation such as electric vehicles and hybrid vehicles. In the field of transportation, power semiconductors such as IGBTs (insulated gate bipolar transistors) that play a role of power conversion and control are used. The IGBT includes IGBT chips (power chips) and bonding wires for connecting between chips, i.e., the power chips, and connecting the IGBT chip (power chip) to an external electrode. For a bonding wire for a power semiconductor, a relatively thick aluminum wire having a wire diameter (diameter) of 40 μm or more and 700 μm or less is often used to pass a large current.

Power modules for electric vehicles are exposed to severe environments such as wide temperature changes, high humidity, salty environments, and vibrations, since the electric vehicles themselves are used in various regions. For this reason, the material of the power module is required to have high current density resistance, high temperature durability, and high heat dissipation. Further, in a use environment of a power module for an electric vehicle, in addition to the temperature changes described above, a temperature cycle of heating and cooling due to running of the electric vehicle also occurs. while the electric vehicle is running, it repeats a cycle of stopping energization at the time of stopping and starting energization at the time of starting driving. This energization raises the temperature of the power chip and also raises the temperature of an aluminum wire on an electrode pad provided on the surface of the power chip. Since energization is stopped at the time of stopping, the aluminum wires and the power chips are rapidly cooled. As driving start and stop of the automobile is frequently repeated for a long period of time, this heating and cooling temperature cycle is also repeated, and thermal stress is generated due to the difference in thermal expansion coefficient between the power chip and the aluminum wire, thereby causing metal fatigue at a bonding portion between the power chip and the aluminum wire and at the aluminum wire. This increases the possibilities of causing peeling or breakage of the bonding portion and wire cracking. Accordingly, an aluminum wire that solves these problems and has long-term reliability is required.

In addition, the role of power semiconductors is becoming important in such as IoT (Internet of Things), which has been talked about in recent years. As IoT-equipped home appliances become smaller, thinner, and denser year by year, power semiconductors are further becoming smaller, thinner, and denser, and a bonding space between the power chip and the aluminum wire is becoming smaller. Therefore, in aluminum wire bonding, it is necessary to effectively use the limited space. For example, instead of bonding to a power chip (first bonding) and bonding to an external electrode (second bonding) by means of an aluminum wire in the same direction, the aluminum wire after the first bonding needs to be bent at a predetermined angle toward a vacant gap of the external electrode for bonding. Thus, the aluminum wire requires a degree of freedom for bending such that it can particularly change the wire direction (angle) of the second bonding; accordingly, followability of the aluminum wire is an extremely important property.

For example, in the first bonding (connection to an electrode on a semiconductor chip) and the second bonding (connection to an external electrode on a lead frame or a substrate) of an aluminum wire, a wedge tool (sometimes simply referred to as a "tool") having an alligator (groove) at the tip for holding a wire is used, the wire is fitted in the alligator, and the wire is pressed against the bonding part for bonding. In the case of using an aluminum wire that lacks followability for lateral bending, the wire cannot be bent at a desired angle, and a part of the wire may be detached from the alligator of the wedge tool. If the second bonding is performed while a part of the wire is detached, a short failure may occur when the bonding position deviates from the intended position and contacts another electrode. Further, in a state where the wire is detached from the tool, the tip of the wedge tool may directly contact the element and destroy the semiconductor element.

In addition, a wire that requires long-term reliability typically tends to preferably have higher strength. High strength means high tensile strength, yield strength, hardness, and the like, whereas a wire with higher strength tends to have poorer followability. Accordingly, it is extremely difficult to simultaneously overcome the conflicting problems of strength and followability, and there have been no cases so far in which both problems have been solved simultaneously.

Conventionally, there are known techniques for adjusting alloying components of an aluminum wire to improve reliability of a bonding portion mainly in a state of a high temperature (see, for example, Patent Literatures 1 to 4). However, these prior arts do not solve the problem of followability of the aluminum wire.

The invention described in Patent Literature 1 is "an aluminum alloy thin wire for ultrasonic bonding of a semiconductor device, comprising 0.2 to 2.0 mass % of iron (Fe) and the balance of aluminum (Al) having a purity of 99.99 mass % or more, wherein 0.01 to 0.05% of iron (Fe) is dissolved in an aluminum (Al) matrix of the aluminum alloy thin wire, a wire drawing matrix structure in a cross-section of the aluminum alloy thin wire is a homogeneous fine recrystallized structure of the order of several μm, and intermetallic compound particles of iron (Fe) and aluminum (Al) are uniformly crystallized on an interface and an inner surface of the structure". Patent Literature 1 describes that, by adding a step of a solution and quenching treatment before a refining heat treatment, the amount of iron (Fe) dissolved in the aluminum (Al) matrix is increased to 0.052% which is the solid solubility limit at 650° C., and refining a crystal grain diameter of the Al—Fe alloy wire is made possible by the subsequent normal cold continuous wire drawing and the subsequent refining heat treatment, and that by highly purifying Al, dynamic recrystallization is caused at the time of bonding to avoid chip damage (see paragraph 0013 of the description).

The invention described in Patent Literature 2 is "an aluminum alloy thin wire for ultrasonic bonding to an aluminum pad of a semiconductor element, comprising iron (Fe) %, silicon (Si), and the balance of a high-purity aluminum (Al) alloy, wherein the aluminum alloy thin wire is an alloy containing iron (Fe) of 0.01 to 0.2 mass %, silicon (Si) of 1 to 20 mass ppm, and the balance of aluminum (Al) having a purity of 99.997 mass % or more, and the fine structure has a solid solution amount of Fe being 0.01 to 0.06%, a precipitation amount of Fe being 7 times or less the Fe solid solution amount, and an average crystal grain diameter being 6 to 12 μm". Patent Literature 2 describes that the recrystallization temperature is stabilized by keeping the ratio of the Fe precipitation amount and the Fe solid solution amount in a certain range, and further the strength is improved by adding a small amount of Si, to consequently stabilize the results of the heat shock test (see paragraph 0012 of the description).

The invention described in Patent Literature 3 is "comprising Al or an Al alloy, wherein an average crystal grain diameter in a cross-section in a direction perpendicular to a wire axis is 0.01 to 50 μm, and when measuring crystal orientations on the cross-section in the direction perpendicular to the wire axis, a crystal orientation <111> having an angular difference of 15° or less with respect to a wire longitudinal direction has an orientation proportion of 30 to 90% among crystal orientations in the wire longitudinal direction". Patent Literature 3 describes that even when the semiconductor device is continuously operated for a long time under a high temperature environment, it is possible to ensure the reliability of the bonding portions in the semiconductor device after long-term operation under a high temperature (see paragraph 0012 of the description).

The invention described in Patent Literature 4 is "containing 0.02 to 1 mass % of Fe, and further containing a total of 0.05 to 0.5 mass % of at least one or more kinds of Mn and Cr, wherein the balance contains Al and unavoidable impurities, and a total solid solution amount of Fe, Mn, and Cr is 0.01 to 1%". Patent Literature 4 describes that, in addition to containing Fe, one or both of Mn and Cr are contained in a predetermined amount, and in the solution heat treatment and the subsequent quenching treatment, the total solid solution amount of Fe, Mn, and Cr is set to 0.01 to 1% to thereby increase the recrystallization temperature of the wire, so that even when the semiconductor device is continuously operated for a long time under a high temperature environment, it is possible to sufficiently suppress the progress of the recrystallization of the bonding wire and prevent deterioration of the wire strength (see paragraph 0014 of the description). Further, Patent Literature 4 describes that, in a cross-section (C section) perpendicular to the longitudinal direction of the bonding wire, the crystal area ratio (<111> orientation area ratio) in which the angular difference between the crystal <111> orientation and the wire longitudinal direction is within 15° is preferably 30 to 90%, so that recrystallization due to the refining heat treatment at the time of wire drawing progresses appropriately, the wire is softened, and thus it is possible to prevent occurrence of chip cracking at the time of bonding, deterioration of bondability of the bonding portion, and the like (see paragraph 0026 of the description).

PATENT LITERATURE

Patent Literature 1: Japanese Patent Laid-Open No. 2013-258324
Patent Literature 2: Japanese Patent Laid-Open No. 2014-129578
Patent Literature 3: International Publication No. WO 2020/184655
Patent Literature 4: Japanese Patent Laid-Open No. 2020-059886

SUMMARY

An object of the present invention is to provide an aluminum wire that can follow lateral bending when bonding a power chip for a power semiconductor and an external electrode (hardly detached a from wedge tool) and has excellent: long-term reliability (long life in a power cycle test).

The object will be described in detail. First, an aluminum wire with one end of the wire detached from a groove of a wedge tool is illustrated. A photograph on the right side of FIG. 3 shows a normal state in which the wire is not detached from the wedge tool, and a photograph on the left side is an enlarged photograph of a wedge tool portion of the wire in which the wedge tool became detached at the time of the second bonding. As described above, the wedge tool has, at its tip, an alligator for holding the wire and a guide hole for guiding the wire, and the wire is passed through the guide hole and fitted into the alligator, where the wire is pressed and bonded to a bonding portion. In the photograph on the right side of FIG. 3, the wire is passed through the guide hole on the left side of the tip of the wedge tool in the figure and is precisely fitted into the alligator of the tool. In the photograph on the left side, the aluminum wire drawn from the first bonding passes through the guide hole on the left side, whereas it can be seen that a tip of the aluminum wire protrudes from the alligator of the tool in the obliquely downward direction in the figure. Accordingly, the second bonding cannot be done well, and in the next wire cutting step in continuous bonding, a cutter on the right side cannot precisely cut a tip portion of the aluminum wire in a preset manner.

FIG. 4 is a photograph of a bonding part of an aluminum wire observed at a magnification of 75 times. A photograph on the left side represents a comparative example (abnormal); the right side, an example (normal); the upper, a first bonding portion; and the lower, a second bonding portion. Two sets each were bonded. In the right upper and lower photographs of FIG. 4, a bonding part of the wire (a part where the wire is relatively thick in the drawing) is pressed uniformly in the wire thickness direction, and a cut portion of the wire (a tip of the wire) in the upper photograph of FIG. 4 is also precisely cut perpendicular to the axial direction of the wire. In contrast, a one-sided contact occurs when the second bonding is performed with the aluminum wire protruding from the alligator portion of the tool as in the photograph on the left side of FIG. 3, and a part with a contact mark on the inner side of the bend of the wire at a bonding part of the wire (a part where the wire is relatively thick in the drawing) is a part that made a one-sided contact as in the lower left photograph of FIG. 4. The aluminum wire at the one-sided contact part becomes thin, and even if bonding can be done as it is, the bonding strength becomes weak, increasing the possibility of peeling during use. For example, the upper left photograph of FIG. 4 is a photograph in which the wire that made a one-sided contact is subjected to the next first bonding, and a tip of the wire is obliquely cut in the upper part of the drawing. This is because the aluminum wire was cut while the tool was detached in the previous second bonding (see the lower left photograph of FIG. 4), and thus the wire is cut obliquely. In the worst case, as in the photograph of the "first bonding portion" in the upper left of FIG. 4, where a bonding mark (a scratch on the substrate) is seen on the right side of the wire, a wire bonding failure occurs at the first bonding portion (when no wire bonding failure occurs, there are two first bonding portions as in the upper right of FIG. 4). Further, if the aluminum wire protruding from the wedge tool portion is grounded to an electrode pad on a chip, the wedge tool portion directly contacts the electrode pad, which may cause chip cracking. It should be noted that in the lower right photograph of FIG. 4, the wire was bonded with a bending angle of the wire set to 45 degrees, and the bonding could be done without any problems at all. However, in the lower left photograph, although the wire was gently bent at a bending angle of about 30 degrees, the followability of the wire was poor, and a one-sided contact occurred.

Further, as described above, in a case where an aluminum wire is used for electrode bonding of an IGBT mounted in an electric vehicle or the like, in addition to a harsh use environment such as high temperature, high humidity, and vibration, stop, run, stop, and run are frequently repeated during driving in a city. Along with this, energization stop, energization restart, energization stop, and energization restart are frequently repeated. This is a very bad use condition for a bonding portion between the aluminum wire and the electrode and for the life of the aluminum wire itself. That is, the wire is rapidly heated at the start of energization and rapidly cooled at the time of stop, and this repeated rapid heating and rapid cooling causes repeated expansion and contraction of the wire, consequently increasing the risks of peeling of the bonding portion due to thermal stress and cracking and breakage of the wire itself. In particular, since there is a difference of about 10 times in linear expansion coefficient between an aluminum wire and a silicon chip, peeling is likely to occur due to a difference in thermal contraction between the wire and the chip bonding portion.

A power cycle test is for evaluating the life of long-term reliability of an aluminum wire bonding portion. If the life evaluation in the power cycle test is high, the wire can obtain long-term reliability even when actually mounted in an automobile, a home appliance, or the like. Here, although the detailed conditions will be described later, the power cycle test will be briefly described.

The power cycle test repeats a cycle of energizing an aluminum wire so that a surface temperature of a power chip to which the aluminum wire has been bonded reaches 150° C., stopping the energization and then cooling it until the surface temperature reaches 50° C. That is, it is a test of repeating a cycle of rapid cooling and rapid heating with a temperature difference of 100° C. to evaluate the number of operations until a problem occurs. An operation without any problems is an operation in which the rate of increase in the potential difference between the front and back sides of the chip when the power chip is energized at the start of the test continues to change within a range of less than 5%. That is, when the potential difference between the front and back sides of the power chip electrode at the time of energization increases by more than 5% from the initial value, it is evaluated that a problem has occurred, which is evaluated as a sample life (the number of cycles) of the power cycle test.

As described above, there have been so far no cases of developing an aluminum wire that simultaneously overcomes the long life in the power cycle test and the wire detachment from the wedge tool.

As a result of repeated earnest studies, the present inventors discovered that, by controlling an orientation index of an aluminum wire and an amount of precipitated particles of an intermetallic compound, the two problems of the long life in the power cycle test and prevention of the wedge tool detachment of the wire, that is, the followability of the wire are overcome simultaneously, and succeeded in inventing an aluminum wire achieving that.

An aluminum wire according to an embodiment is an aluminum wire made of an aluminum alloy having an aluminum purity of 99 mass % or more and containing, relative to a total amount of the aluminum alloy, a total of 0.01 mass % or more and 1 mass % or less of iron and silicon, wherein in a lateral cross-section in a direction perpendicular to a wire axis of the aluminum wire, an orientation index of (111) is 1 or more, an orientation index of (200) is 1 or less, and an area ratio of precipitated particles is 0.02% or more and 2% or less.

In the aluminum wire according to the embodiment, the aluminum alloy preferably contains, relative to the total amount, a total of 0.1 mass % or more and 1 mass % or less of iron and silicon, and an area ratio of the precipitated particles is preferably 0.1% or more and 2% or less.

The aluminum wire according to the embodiment preferably further contains a total of 50 mass ppm or more and 800 mass ppm or less of at least one element of gallium and vanadium.

In the aluminum wire according to the embodiment, a residual resistance ratio represented by the following formula (1) is preferably 10 or more.

Residual resistance ratio=(electric resistance at room temperature of 300 K/(electric resistance in liquid helium at 4.2 K)        (1)

In the aluminum wire according to the embodiment, an area ratio of the precipitated particles is preferably 0.2% or more and 1.8% or less.

In the aluminum wire according to the embodiment, an aluminum purity of the aluminum alloy is preferably 99.9 mass % or less.

In the aluminum wire according to the embodiment, an orientation index of the (111) is preferably 1.3 or more.

In the aluminum wire according to the embodiment, an orientation index of the (200) is preferably 0.6 or less.

In the aluminum wire according to the embodiment, a content ratio of iron and silicon in the aluminum alloy is preferably 0.3 or more and 90 or less by mass ratio represented by iron/silicon.

In the aluminum wire according to the embodiment, a wire diameter thereof is preferably 40 μm or more and 700 μm or less.

An aluminum wire manufacturing method according to the embodiment includes a step of preparing an aluminum alloy material, the aluminum alloy material being an aluminum alloy having an aluminum purity of 99 mass % or more and containing, relative to a total amount of the aluminum alloy, a total of 0.01 mass % or more and 1 mass % or less of iron and silicon, and a step of performing wire drawing on the aluminum alloy material.

In the aluminum wire manufacturing method according to the embodiment, the step of performing wire drawing preferably includes an intermediate wire drawing step of obtaining an intermediate wire rod by performing wire drawing on the aluminum alloy material so as to have a wire diameter of 7 to 130 times a final wire diameter thereof, and a solution treatment step in which the intermediate wire rod is heated at 400° C. to 560° C. and then quenched, and the step of performing wire drawing is preferably a step of performing wire drawing so as to obtain a final wire diameter of 40 μm or more and 700 μm or less.

Advantageous Effects of Invention

According to the aluminum wire of the present invention, it is possible to achieve both of long-term reliability and followability for lateral bending which does not cause tool detachment. It is considered that in the aluminum wire of the present invention, the effects of the respective configurations are complicatedly intertwined with one another to form a synergistic effect, solving the problems of the long life of the power test cycle and the followability for lateral bending simultaneously.

DETAILED DESCRIPTION

Hereinafter, an aluminum wire of an embodiment of the present invention will be described. An aluminum wire of the present embodiment is an aluminum wire made of an aluminum alloy having an aluminum purity of 99 mass % or more and containing, relative to a total amount of the aluminum alloy, a total of 0.01 mass % or more and 1 mass % or less of iron and silicon, wherein in a lateral cross-section in a direction perpendicular to a wire axis of the aluminum wire, an orientation index of (111) is 1 or more, an orientation index of (200) is 1 or less, and an area ratio of precipitated particles is in a range of 0.02% or more and 2% or less. A detailed description will be given below of the history of trial and error until the present invention is obtained, a configuration of the aluminum wire of the present invention, and a manufacturing method thereof.

The present inventors experimentally produced many types of aluminum wires with different compositions by several different manufacturing methods. As a result of careful observation of a cross-sectional structure perpendicular to the wire axial direction of the prototype wire, there could be seen an overall fine crystal grain structure, an overall large crystal grain structure, and a crystal structure in which a large size of crystal grain and a small size of crystal grain partially coexist in the same cross-section. The fact that the crystal grains partially differ in size in the same cross-section suggests that the crystal grain structure cannot be an indicator of the properties of the entire aluminum wire. Further, it has been found that there are granular substances (herein referred to as "precipitated particles") on these crystal grain structures. The precipitated particles will be described later.

Figure 5:
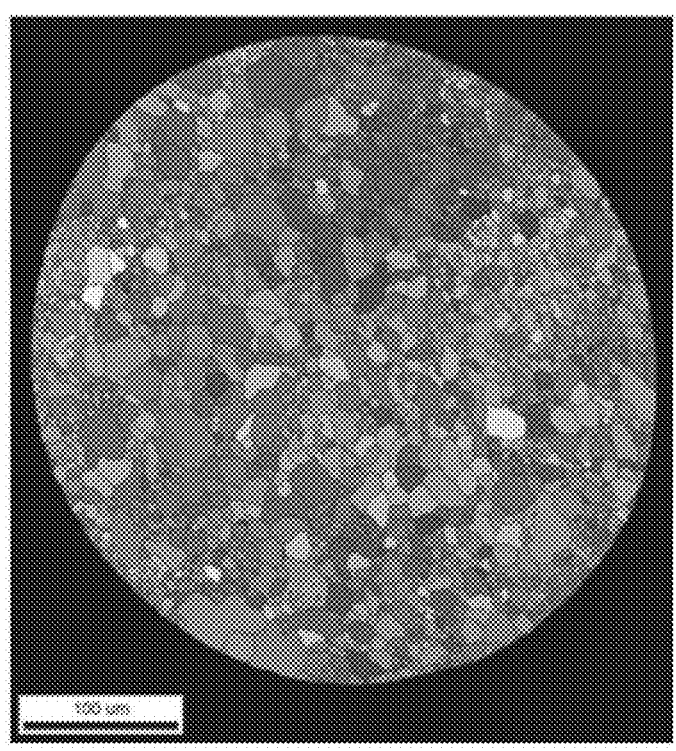
FIG. 5 is a photograph showing a result of EBSD (electron backscatter diffraction pattern) measurement of crystal orientations in a cross-section perpendicular to the wire axial direction of an aluminum wire of an example. The result of the EBSD measurement is shown by color-coding specific crystal orientations in the respective crystal grains, which is shown in black and white shading in FIG. 5. The photograph of FIG. 5 shows wide variations in the shading, indicating large variations in the crystal orientations.

The crystal orientations were measured by an EBSD (electron backscatter diffraction pattern) to see if there is any difference in the crystal orientations of the structure in which these crystal grains differ in size. In FIG. 5, shading in the crystal grains represents the difference in the crystal orientations. It can be understood from FIG. 5 that the crystal orientations differ depending on the part. This suggests that the state of some of the crystal orientations cannot be an indicator of the properties of the entire wire. In a wire drawing step, the way of processing changes along the longitudinal direction of the wire (wire axial direction). That is, practical uniformity is maintained, whereas strictly speaking, influences such as micro-vibration of the wire at the time of wire drawing using a die and frictional heat between the wire and the die may cause parts with different properties depending on the position in the longitudinal direction. Accordingly, the crystal orientations of the cross-section cannot be uniquely determined, and as a result, it has been found to be extremely difficult to uniquely express the properties of the entire aluminum wire by the crystal orientation ratio.

Thus, as a result of examination of an indicator capable of expressing the properties of the entire aluminum wire, an orientation index was determined as an indicator. The orientation index is a value obtained by dividing the diffraction intensity ratio of each crystal plane of the wire, that is, (diffraction intensity of each crystal plane/a sum of diffraction intensities of the respective crystal planes) by the diffraction intensity ratio of a non-oriented aluminum powder standard sample. By obtaining the orientation index, it can be quantitatively determined which crystal plane is preferentially oriented and which crystal plane is not preferentially oriented, that is, the tendency of preferential orientation of the crystal plane. The orientation index is expressed by a mathematical formula, i.e., the following Wilson's formula. The analysis intensity ratio of the standard sample of aluminum powder employed a value of the ICDD card (also called PDF, ASTM card, or JPCDS card) PDF No. 00-004-0787 (aluminum) provided by ICDD (International Centre for Diffraction Data, a non-profit scientific organization that handles powder diffraction data). A cross-section of the wire rod in the direction perpendicular to the wire axis is subjected to X-ray diffraction, and the diffraction intensity ratio of each crystal plane of the aluminum is used to determine an orientation index N of each crystal plane by means of the following Wilson's formula (1).

$$\text{Orientation index } (N) = \frac{\left(\dfrac{(I/I(hkl))}{\sum I/I(hkl)}\right)}{\left(\dfrac{ICDD\ I/I(hkl)}{\sum ICDD\ I/I(hkl)}\right)} \tag{1}$$

In the above formula (1), I/I(hkl) is the diffraction intensity ratio on the (hkl) plane of the sample, ICDD I/I(hkl) is the diffraction intensity ratio on the (hkl) plane of the ICDD card, and ΣI/I(hkl) and ΣICDD I/I(hkl) are each a sum of the diffraction intensity ratios of all crystal planes. It should be noted that the diffraction intensity can be obtained from the area ratio of each peak.

Regarding the orientation index of the aluminum wire, forty aluminum wires were bundled and embedded in resin, and the lateral cross-section in the direction perpendicular to the wire axis was subjected to X-ray diffraction to measure the diffraction intensities of (111), (200), (220), (311), (222), and (400), then the orientation index of each of the crystal planes was obtained by means of the Wilson's formula. The orientation index is a value of a preferential orientation of a solid aluminum wire assembly, which is not affected by variations of, for example, a dual structure of a central portion and a peripheral portion of the individual aluminum wire. In addition, the orientation index is a value corrected to a comparison value with a standard sample and thus can indicate more objective orientation of the aluminum wire.

As a result of experimentally producing aluminum wires with various orientation indexes and measuring the orientation indexes through earnest studies, the present inventors discovered that an aluminum wire controlled such that the orientation index of (111) of a plane perpendicular to the wire axis is 1 or more and the orientation index of (200) is 1 or less is long life in the power cycle test.

It should be noted that as described above, a crystal orientation ratio is the similar indicator. The crystal orientation ratio is a value obtained by measuring the occupancy of crystal orientations in a two-dimensional plane obtained by cutting an aluminum wire at a certain area. As shown in FIG. 5, the crystal orientation ratio in the cross-section perpendicular to the wire axis depends on the cutting position of the aluminum wire, and even with the same composition and manufacturing condition, some of the crystal orientations are not oriented in a certain direction and have variations; accordingly, is it difficult to determine the objective properties of the aluminum wire only from the crystal orientation ratio.

The present inventors actually measured the crystal orientation ratio of each of samples in examples described later but could not obtain a correlation with the power cycle life. Wires having a crystal orientation ratio of <111> being as large as 50% or more roughly tend to have a long life, whereas there were wires having a long life of 200,000 cycles or more among wires having a crystal orientation ratio of <111> being as small as 20% range.

Next, precipitated particles will be described. The inventors experimentally produced many aluminum wires having different aluminum purities in various manufacturing steps and carefully observed a structure of metal a cross-section perpendicular to the wire axial direction; as a result, they discovered that precipitated particles on an aluminum-based matrix differ in shape, size, and number depending on the composition and manufacturing condition of each prototype wire.

Presuming that these precipitated particles have some relationship with long-term reliability and followability of the wire, the inventors analyzed a photograph of the precipitated particles taken with a SEM (scanning electron microscope reflection electron image) using image processing software and quantified a cross-sectional area of the precipitated particles on the image. Although the quantification method will be described in detail in the examples, the inventors discovered that the area ratio of the precipitated particles to the cross-section perpendicular to the wire axial direction correlates with the life in the power cycle test and the wire followability. That is, the inventors presumed that the area ratio of the precipitated particles varies depending on the combinations of different aluminum purities and wire manufacturing methods.

The inventors experimentally produced many wires having combinations of different orientation indexes and area ratios of the precipitated particles and diligently performed power cycle tests and tool detachment evaluation; as a result, they invented a wire that has long-term reliability under the following conditions and has followability which does not cause tool detachment.

The aluminum wire having long-term reliability and followability which does not cause tool detachment is an aluminum wire having an aluminum purity of 99 mass % or more and containing iron and silicon with total of 0.01 mass % or more and 1 mass % or less of iron and silicon, wherein the cross-section perpendicular to the wire axial direction has an orientation index of (111) being 1 or more and an orientation index of (200) being 1 or less, and an area ratio of the precipitated particles is 0.02% or more and 2% or less with respect to the cross-section perpendicular to the wire axial direction. These configurations are intertwined with one another to form a synergistic effect, solving the two conflicting problems simultaneously. From the viewpoint of improving long-term reliability, the orientation index of (111) of the cross-section perpendicular to the wire axial direction of the aluminum wire is preferably 1.2 or more, more preferably 1.4 or more, and the orientation index of (200) is preferably 0.7 or less, more preferably 0.5 or less.

The precipitated particles are particles having a size (maximum particle length) of about 0.01 to 30 μm in such as lump, ring, plate, needle, approximately spherical, and irregular shapes, which can be observed on an aluminum-based matrix. These particles are considered to include particles crystallized or precipitated during the manufacturing process and particles contained in the aluminum raw material. In addition, the precipitated particles are considered to include any one, two or more kinds of an alloy of aluminum and iron, an intermetallic compound, an aluminum, silicon, an alloy of iron, and intermetallic compound, and a precipitate of elemental silicon.

The area ratio of the precipitated particles can be controlled by the composition of the wire (a content ratio of iron to silicon), heat treatment temperature, time, timing of heat treatment, wire drawing conditions, and the like. It should be noted that the area ratio of the precipitated particles is a ratio of an area occupied by the precipitated particles to a cross-sectional area of a lateral cross-section perpendicular to the wire axis of the aluminum wire. The experimentally produced aluminum wire was measured to obtain the area ratio of the precipitated particles in the cross-section of each of the tip, the rear end, and the intermediate portion. The obtained values were almost the same regardless of the position in the wire, and the variations in the area ratio depending on the measurement part were smaller than those in the crystal orientation ratio. That is, this suggests that the area ratio of the precipitated particles in a certain cross-section perpendicular to the wire axis is representative of the area ratio of the entire wire. The area ratio of the precipitated particles can be calculated as follows. When a lateral cross-section perpendicular to the wire axis of an aluminum wire is analyzed using a SEM, the precipitated particles are displayed as pixels with a high brightness value due to the difference of the composition from the other region. The region other than the precipitated particles (in the aluminum matrix) is displayed with a low brightness value. This SEM image is binarized by determining a threshold of the brightness value (for example, 0.95) for separating the precipitated particles from the other region by means of a histogram or the like, and an area ratio of the region of the precipitated particles to the whole is calculated. It should be noted that the brightness value is a value normalized such that black is 0 and white is 1.

Although the mechanism that achieves both of the two conflicting properties in the above configurations is not necessarily clear, the content of iron and silicon and the area ratio of precipitated particles are greatly related to long-term reliability and followability of the wire, and it is difficult to achieve both of these properties when the content of iron and silicon is too little or too much.

In the aluminum wire of the present embodiment, the area ratio of the precipitated particles is in a range of 0.02% or more and 2% or less. From the viewpoint of improving followability, the area ratio of the precipitated particles is preferably 0.05% or more, more preferably 0.1% or more, even more preferably 0.2% or more. Furthermore, it is preferably 1% or less, more preferably 0.8% or less.

Controlling the orientation index and the area ratio of the precipitated particles brings a synergistic effect to the long life in power test the cycle (improvement of long-term reliability) and the aluminum wire detachment from the wedge tool. Further, the inventors examined many additive elements and found that containing, among those elements, in particular, both elements of iron (Fe) and silicon (Si) such that the total amount is 0.01 mass % or more and 1 mass % or less leads to a longer life and less chance of tool detachment, and further containing at least one element of gallium (Ga) and vanadium (V) such that the total is 50 mass ppm or more and 800 mass ppm or less leads to an increased residual resistance ratio and suppression of heat generation at the time of energization.

The aluminum wire of the present embodiment is made of an aluminum alloy having an aluminum purity (an amount of aluminum relative to the total amount of the aluminum wire) of 99 mass % or more. That is, the aluminum wire of the present embodiment has an aluminum purity of 99 mass % or more. Thus, the aluminum wire of the embodiment has present sufficient electric conductivity and exhibits good followability. An aluminum purity of the aluminum wire is preferably 99.9 mass % or less. An aluminum purity being 99.9 mass % or less allows to contain a sufficient amount of iron and silicon and further contain, as necessary, trace elements (gallium and vanadium) or trace elements (also referred to as additive elements, i.e., magnesium (Mg), copper (Cu), nickel (Ni), zinc (Zn), chromium (Cr), manganese (Mn), titanium (Ti), zirconium (Zr), tungsten (W), and scandium (Sc), which will be described later), thus improving long-term reliability of the aluminum wire.

Further, as described above, the aluminum wire of the present embodiment is made of an aluminum alloy containing a total of 0.01 mass % or more and 1 mass % or less of iron and silicon. That is, the aluminum wire of the present embodiment contains, relative to the total amount of the wire, a total of 0.01 mass % or less and 1 mass % of iron and silicon.

The aluminum wire of the present embodiment has a total amount of 0.01 mass % or more of iron and silicon and thus achieves a longer life than conventional aluminum wires. Moreover, when the total amount of iron and silicon exceeds 1 mass %, the area ratio of the precipitated particles becomes too large, which thus causes tool detachment. From the viewpoint of ease of achieving the long life, the total amount of iron and silicon is preferably 0.02 mass % or more, more preferably 0.05 mass % or more, more preferably 0.1 mass % or more, even more preferably 0.13 mass % or more. Furthermore, from the viewpoint of reducing tool detachment while achieving the long life, the total amount of iron and silicon is preferably 0.9 mass % or less, more preferably 0.8 mass % or less.

In the aluminum wire of the present embodiment, the amount of iron, relative to the total amount of the wire, is preferably 0.01 mass % or more, more preferably 0.03 mass % or more, even more preferably 0.05 mass % or more, particularly preferably 0.1 mass % or more, more particularly preferably 0.13 mass % or more. Further, the amount of iron, relative to the total amount of the wire, is preferably 0.95 mass % or less, more preferably 0.9 mass % or less. Further, the amount of silicon, relative to the total amount of the wire, is preferably 0.01 mass % or more, more preferably 0.05 mass % or more. The amount of silicon is preferably 0.5 mass % or less, more preferably 0.4 mass % or less. By combining the above preferred ranges of iron and silicon, the synergistic effect of iron and silicon makes it even easier to obtain long-term reliability of bonding and the effect of suppressing tool detachment.

In the aluminum wire of the present embodiment, the content ratio of iron and silicon is preferably 0.3 or more and 90 or less, more preferably 1.0 or more and 45 or less, by mass ratio represented by iron/silicon. The content ratio of iron and silicon within the above range makes is easy to control the precipitation amount of the precipitated particles and achieve both of followability of the wire and long-term reliability of bonding.

The aluminum wire of the present embodiment preferably contains at least one kind of gallium and vanadium, and in this case, the total amount of gallium and vanadium, relative to the total amount of the wire, is preferably 50 mass ppm or more. Although gallium and vanadium are not essential for the long life of the wire, containing at least one kind of these contributes to the long life of the wire. The upper limit of the content of at least one kind of gallium and vanadium is, though not particularly limited, about 1000 mass ppm, and containing 50 mass ppm or more of these makes it easy to obtain the effect of the further longer life, and the content of 800 mass ppm or less makes it easy to suppress the maximum temperature of the aluminum wire at the time of energization. The content of gallium and vanadium, relative to the total amount of the wire, may be 100 mass ppm or more or 150 mass ppm or more. The content of gallium and vanadium, relative to the total amount of the wire, may be 700 mass ppm or less or 600 mass ppm or less. Regarding the content of gallium and vanadium, when only either one of gallium and vanadium is contained in the wire, the amount of the one may be within the above range, and when both of gallium and vanadium is contained, the total amount of gallium and vanadium may be within the above range.

For example, when the maximum temperature at the time of energization is 150° C. in the case of using an aluminum wire having a purity of 99.99 mass %, the maximum temperature can be reduced to 160° C. or less if the content of gallium and vanadium is 800 mass ppm or less. That is, using an aluminum wire having a purity of 99.99 mass % as a criterion, the rising temperature caused by heat generation at the time of energization can be suppressed within about 10° C.

The aluminum wire of the present embodiment may contain one, two or more kinds of trace elements such as magnesium (Mg), copper (Cu), nickel (Ni), zinc (Zn), chromium (Cr), manganese (Mn), titanium (Ti), zirconium (Zr), tungsten (W), and scandium (Sc), in addition to iron, silicon, gallium, and vanadium. Regarding the content of a trace element(s), a total amount of iron, silicon, gallium, vanadium, and a trace element(s) is 1.0 mass % or less, which is preferably 0.1 mass % or more, relative to the entire wire.

The temperature rise caused by heat generation at energization as compared with the case of using the aluminum wire having a purity of 99.99 mass % described above increases as the residual resistance ratio increases. The residual resistance ratio is affected not only by the amount of impurities and the purity of aluminum but also by processing strain of the wire and the like and thus more accurately reflects the temperature rise caused by heat generation due to energization.

The temperature rise of 30° C. or more with the criterion described above also considerably affects members in contact with the wire. For example, an increase in the temperature of a sealing resin covering the wire increases the possibility in which an element in the resin that causes corrosion of the wire volatilizes and is released from the resin. To prevent corrosion of the wire, a sealing resin having heat resistance, a design for heat dissipation, and the like are required, which thus tends to lead to an increase in manufacturing cost and interfere with the degree of freedom in designing the power semiconductor.

The residual resistance ratio is expressed by the following formula by means of a numerical value representing a ratio of the electric resistance in liquid helium at 4.2 K (kelvin) and the electric resistance at room temperature of 300 K.

$$\text{Residual resistance ratio} = (\text{electric resistance at room temperature})/(\text{electric resistance in liquid helium})$$

The residual resistance ratio of the aluminum wire of the present embodiment is preferably 10 or more, more preferably 15 or more. When the residual resistance ratio is less than 10, the temperature rise due to heat generation at the time of energization is likely to be 30° C. or more with the criterion described above, which may adversely affect peripheral members of the wire.

The wire diameter of the aluminum wire of the present embodiment is typically 40 μm or more and 700 μm or less, which is preferably 70 μm or more and 600 μm or less, more preferably 100 μm or more and 500 μm or less. The cross-sectional shape of the aluminum wire is typically circular and additionally may be elliptical, oval, rectangular, or the like.

(Aluminum Wire Manufacturing Method)

Next, an example of an aluminum wire manufacturing method of the embodiment will be described. It should be noted that the aluminum wire manufacturing method is not limited to the manufacturing method shown below. It is desirable to adjust the conditions as appropriate in view of the weight of the aluminum wire to be manufactured and the processing capacity of the heat treatment furnace.

Iron and silicon are melted together in an aluminum having a high purity of 99 mass % or more to thereby prepare molten aluminum. The purity of high-purity aluminum used as a raw material may be 99.9 mass % or more or 99.99 mass % or more. A heating furnace such as an arc heating furnace, a high-frequency heating furnace, a resistance heating furnace, or a continuous casting furnace is used for melting. The molten aluminum in the heating furnace, though which may be melted in the atmosphere, may be melted while being maintained in a vacuum or an inert gas atmosphere such as argon or nitrogen, for the purpose of preventing incorporation of and the oxygen hydrogen from atmosphere. The molten material may be solidified by continuous casting from the heating furnace so as to have a predetermined wire diameter (diameter). Alternatively, the molten aluminum may be cast into a mold to make an ingot, and the ingot may be set in an extruder and subjected to extrusion molding so as to have a predetermined wire diameter.

The wire rod obtained by the above step is subjected to wire drawing so as to obtain an intermediate wire rod having a wire diameter of 5.0 mm. The wire diameter of the intermediate wire rod is typically 7 to 130 times the final wire diameter. Next, an intermediate heat treatment is performed on the wire after the wire drawing (intermediate wire rod) for heating at 400° C. to 560° C. for 60 minutes to 420 minutes and then a solution treatment is performed on the wire for quenching. The quenching speed is, for example, 20° C./second or more and 300° C./second or less, preferably 20° C./second or more and 100° C./second or less. Although the quenching speed may be a speed from the start of quenching to the end, more preferably, the cooling speed in the temperature range from 400° C. to 300° C. being within the above range makes it easier to obtain the above effects. The main purpose of the solution treatment is to dissolve elements other than aluminum into the aluminum matrix. After the solution treatment, wire drawing is performed so as to obtain a final wire diameter. In the wire drawing, the wire is passed through a plurality of cemented carbide dies or diamond dies in order so as to reduce the wire diameter of the wire stepwise.

The wire drawn to the final wire diameter is subjected to a final heat treatment. The final heat treatment mainly acts as relieving strain of a metal structure remaining inside the wire and adjusting the mechanical property and the like of the wire. However, since it may affect the area ratio of the precipitated particles, the temperature and treatment time of the final heat treatment are adjusted in view of these.

The intermediate heat treatment and the final heat treatment include a running heat treatment in which a wire is passed through a heating atmosphere heated to a predetermined temperature and heat-treated, and a batch heat treatment in which a wire is heated in a closed furnace. The final heat treatment in the present embodiment is preferably performed by the batch heat treatment at 200° C. or more and 340° C. or less for about 60 minutes.

(Semiconductor Device)

Next, a configuration of a semiconductor device 100 using the aluminum wire of the embodiment will be described with reference to FIG. 6.

Figure 6:
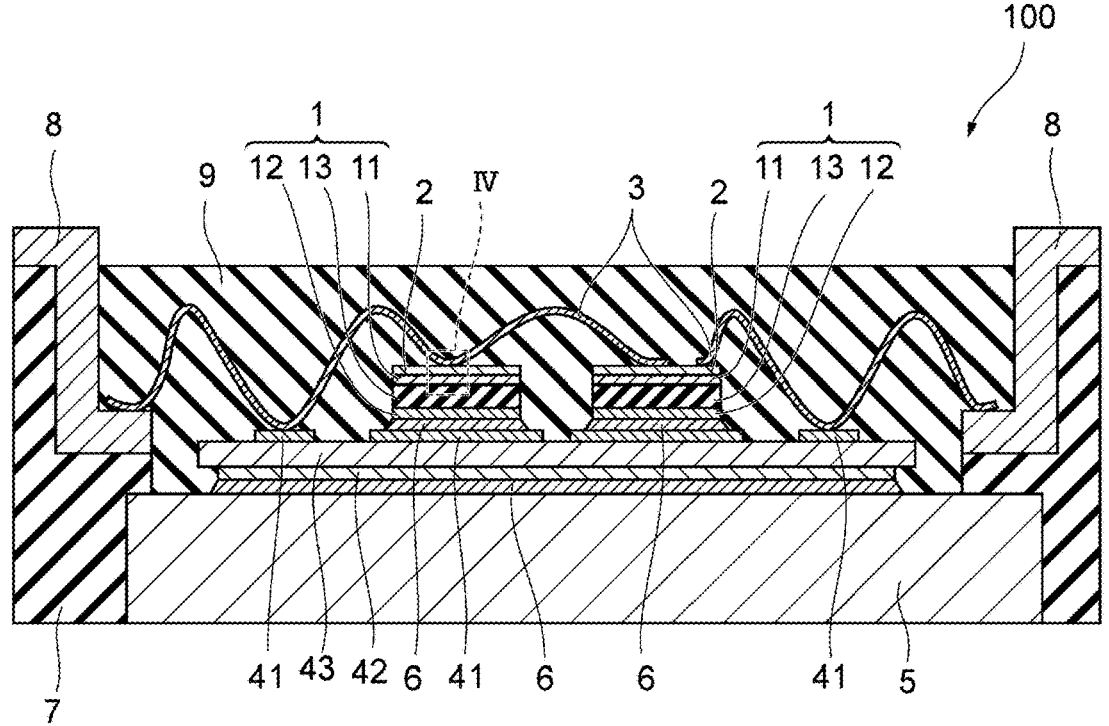
FIG. 6 is a cross-sectional view schematically showing a configuration of a semiconductor device according to an embodiment.

As shown in FIG. 6, the semiconductor device 100 includes a semiconductor element 1, a metal film 2, a wire 3, a circuit pattern 41, a metal pattern 42, an insulating member 43, a heat dissipating member 5, a bonding material 6, a case 7, a terminal 8, and a sealing material 9.

In the present embodiment, the semiconductor element 1 is, for example, a power semiconductor used for a semiconductor for power supply. Examples of the semiconductor element 1 include a metal oxide semiconductor field effect transistor (MOSFET), an IGBT, and the like.

The semiconductor element 1 is formed by laminating an electrode 11, a substrate portion 13, and a back surface electrode 12 in this order. The electrode 11 is, for example, an aluminum (Al)-silicon (Si) electrode, and the substrate portion 13 is, for example, a silicon (Si) substrate, a silicon carbide (Sic) substrate, a gallium nitride (GaN) substrate, or the like.

The metal film 2 is provided on a surface of the electrode 11 opposite to the substrate portion 13 so as to cover the surface of the electrode 11. The metal film 2 is a nickel (Ni) film, a copper (Cu) film, a titanium (Ti) film, a tungsten (W) film, or the like, and is a film formed by electroplating, electroless plating, vapor deposition, sputtering, or the like. The nickel (Ni) film includes a nickel (Ni) electroless plating film, which specifically includes an electroless nickel (Ni)-phosphorus (P) plating film, an electroless nickel (Ni)-boron (B) plating film, and the like. Other preferred aspects of the metal film 2 will be described later.

The wire 3 is made of the aluminum wire of the embodiment described above, and its configuration and properties are also as described above. The wire 3 is bonded to a surface of the metal film 2.

Figure 8:
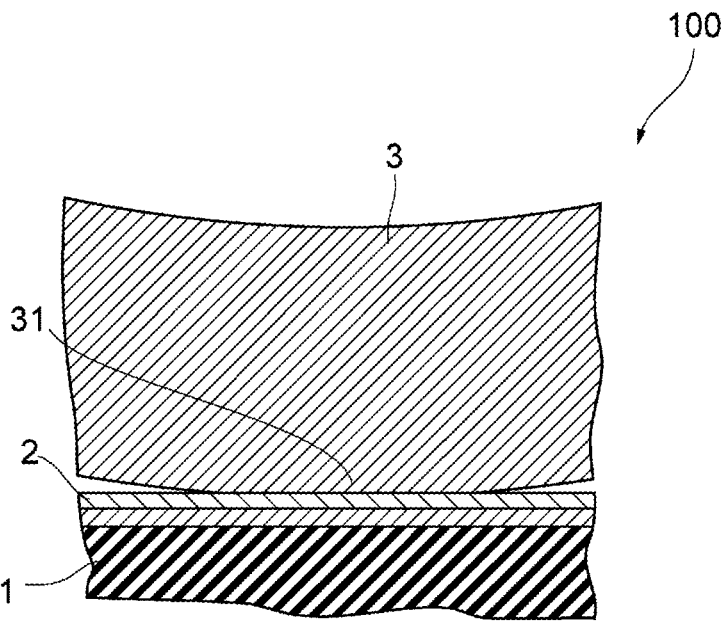
FIG. 8 is an enlarged view of an IV region of FIG. 6.

Next, a bonding structure of the metal film 2 and the wire 3 in the semiconductor device 100 of the embodiment shown in FIG. 6 will be described with reference to FIG. 8. FIG. 8 is an enlarged view schematically showing an IV region of FIG. 6 (the vicinity of a bonding interface of the metal film 2 and the wire 3). It should be noted that the sealing material 9 (see FIG. 6) is not described in FIG. 8.

The vicinity of the bonding interface of the wire 3 and the metal film 2 shown in FIG. 8 is referred to as a bonding portion 31. The bonding portion 31 is, for example, a range from the bonding interface of the wire 3 and the metal film 2 to a position advanced by one crystal grain to the inside of the wire 3.

Figure 9:
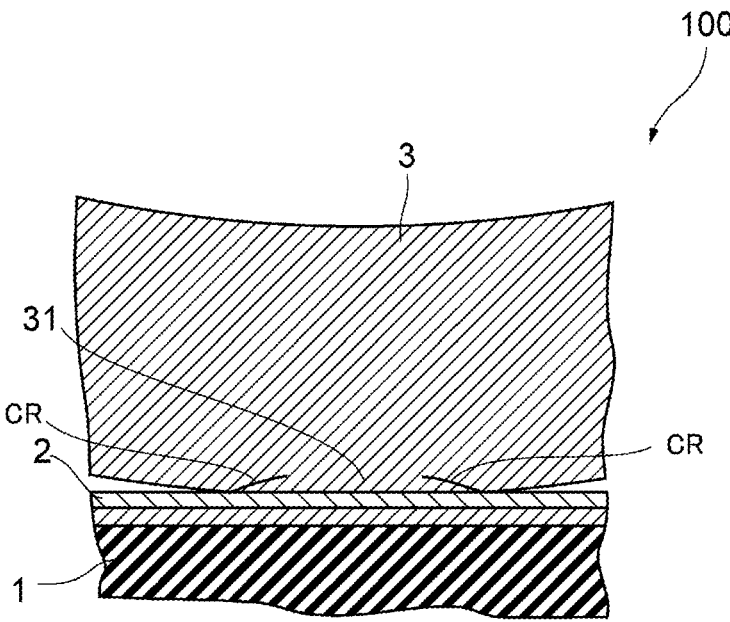
FIG. 9 is a cross-sectional view schematically showing a crack that has occurred n the semiconductor device and corresponding to FIG. 8.
Figure 10:
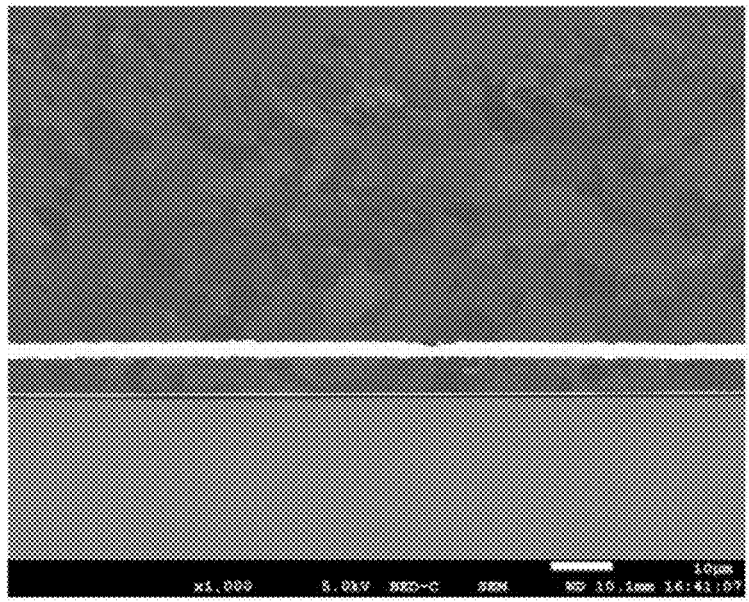
FIG. 10 is a photograph partially showing the semiconductor device of the embodiment in which no crack has occurred.
Figure 11:
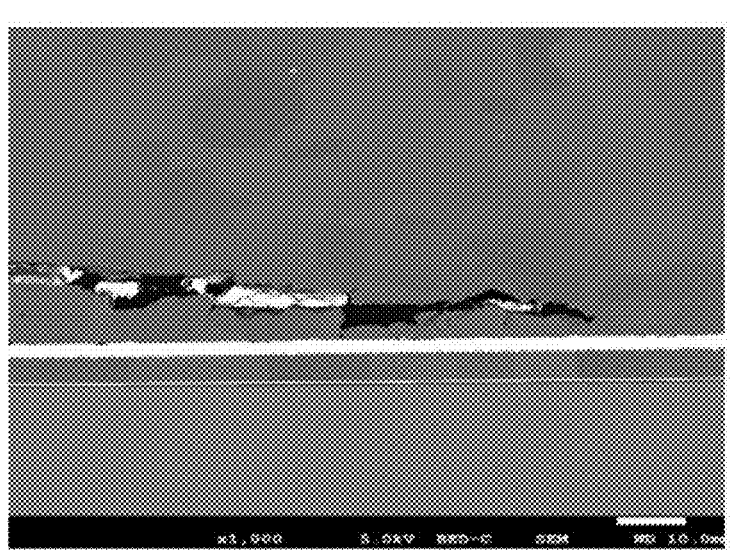
FIG. 11 is a photograph partially showing the semiconductor device in which a crack has occurred.

Here, if the heat resistance of the aluminum wire is not sufficient, repeated start and stop of energization of the wire generates thermal stress in the vicinity of the bonding surface of the metal film and the wire in the bonding portion 31, which may cause metal fatigue in the aluminum wire. As a result, a crack may occur in the wire 3. FIG. 9 is a view schematically showing the bonding portion 31 in which a crack CR has occurred in the wire. Further, FIG. 10 is a photograph in the vicinity of the bonding portion 31 in which no crack has occurred in the wire, and FIG. 11 is a photograph showing a state in which the crack CR has advanced into the wire.

According to the aluminum wire of the embodiment described above, the wire can maintain heat resistance for a long period of time, so that repeated start and stop of energization of the wire causes no crack of the wire, and it is possible to maintain stable bonding of the bonding portion 31 for a long period of time. Further, combined with no failure in wedge bonding due to the good followability of the wire, it is possible to obtain long-term reliability of bonding (first bonding and second bonding).

In addition, since the wire can exhibit heat resistance for a long period of time, it is possible to obtain long-term stability of bonding regardless of the material of a bonding target (the electrode or the metal film). Furthermore, using the metal film 2 of the present embodiment allows to further improve the effect of the long-term stability, which is thus preferable.

When the hardness of a bonding target of the wire is lower than that of the wire, a crack that has occurred in the wire may spread to the bonding target and advance thereto. In contrast, when the bonding target is harder than the wire as in the metal film 2 of the present embodiment, even if a minute crack occurs in the wire, the crack does not advance to the bonding target, so that it is considered that crack expansion in the wire and the bonding target is suppressed and further long-term reliability of bonding is achieved.

For the metal film 2 as described above, an electroless nickel (Ni)-phosphorus (P) plating film, an electroless nickel (Ni)-boron (B) plating film, a nickel (Ni) film or a copper (Cu) film formed by electroplating, or a nickel (Ni) film, a copper (Cu) film, a titanium (Ti) film, or a tungsten (W) film formed by vapor deposition or sputtering is preferable. These metal films 2 have a crystal structure. Further, the purity of nickel (Ni) of the metal film 2 is high. This makes it possible to suppress cracking of the metal film 2 at the time of the heat treatment.

The metal film 2 is preferably an electroless nickel (Ni)-phosphorus (P) plating film that does not contain sulfur (S), from the viewpoint of cost, and the phosphorus content is preferably, relative to the total amount of the metal film 2, 8 mass % or less, more preferably 5 mass % or less. When the phosphorus content is 8 mass % or less, the metal film 2 has a crystal structure, so that the hardness of the metal film 2 increases, which makes it possible to suppress cracking of the metal film 2. In addition, since sulfur(S) is not contained, embrittlement of grain boundaries due to segregation of sulfur(S) at the grain boundaries is suppressed, which also makes it possible to suppress cracking of the metal film 2. From the above, heat resistance of the metal film 2 is improved.

Next, the other configuration of the semiconductor device 100 will be described. In the semiconductor device 100; a semiconductor circuit is formed by the semiconductor element 1, the wire 3, the terminal 8, the circuit pattern 41, and the metal pattern 42. The wire 3 is bent in the semiconductor device 100, and this bending portion is used to be bonded to each of the semiconductor element 1, the terminal 8, the circuit pattern 41, and the like.

The bonding material 6, the metal pattern 42, the insulating member 43, the circuit pattern 41, the bonding material 6, and the semiconductor element 1 are laminated in this order on a surface of the heat dissipating member 5 in the semiconductor device 100. The bonding material 6 is made of solder, silver (Ag), and the like for bonding the heat dissipating member 5 and the metal pattern 42 and bonding the circuit pattern 41 and the back surface electrode 12 of the semiconductor element 1. The insulating member 43 is an insulating substrate or the like.

The case 7 is formed by a ring-shaped housing having a space inside and is provided so as to surround an outer periphery of the heat dissipating member 5. The semiconductor element 1, the metal film 2, the wire 3, the circuit pattern 41, the metal pattern 42, the insulating member 43, the bonding material 6, and the sealing material 9, which are described above, are accommodated in the space inside the case 7.

The terminal 8 functions as a connection terminal with external equipment. The terminal 8 is provided on an upper surface of the case 7 and disposed such that one end portion thereof protrudes from the case 7 into the space inside the case 7 and the other end portion protrudes from the case 7 to a region outside the case 7. The sealing material 9 fills the space inside the case 7 so as to include the semiconductor element 1, the metal film 2, the wire 3, the circuit pattern 41, the metal pattern 42, the insulating member 43, and the bonding material 6. The sealing material 9 is a hardened material such as a gel-like sealing resin or a mold resin.

Figure 7:
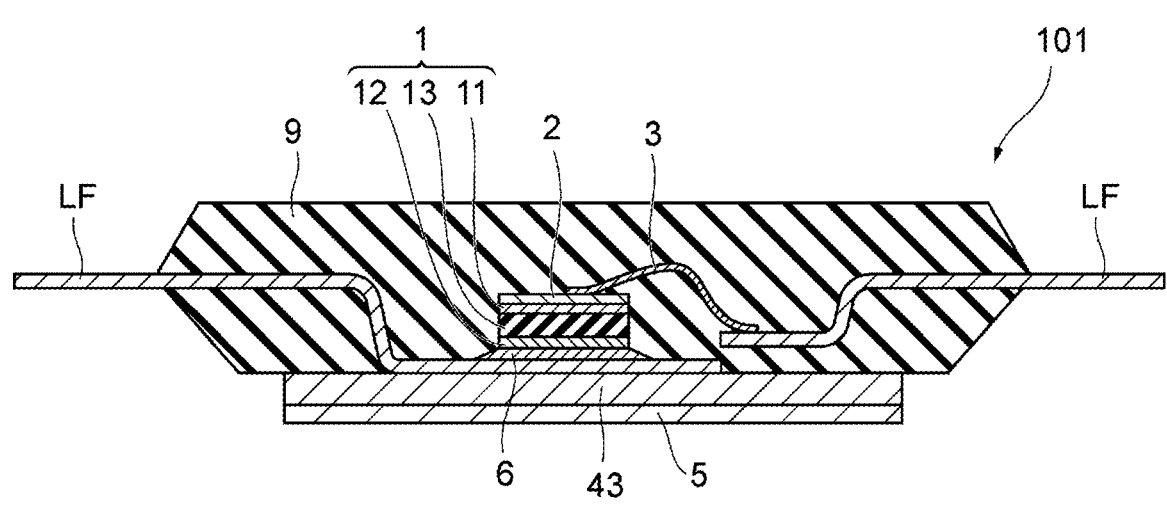
FIG. 7 is a cross-sectional view schematically showing a configuration of a semiconductor device according to another embodiment.

A semiconductor device 101 having a lead frame is shown in FIG. 7 as another embodiment of the semiconductor device. In FIG. 7, the same reference numerals are assigned to the configurations having the same functions as those of the semiconductor device 100 shown in FIG. 6, and a detailed description thereof will be omitted. The semiconductor device 101 shown in FIG. 7 has a lead frame LF, in addition to a semiconductor element 1, a metal film 2, a wire 3, an insulating member 43, a bonding material 6, and a sealing material 9. Since the semiconductor device 101 shown in FIG. 7 has the lead frame LF, the semiconductor device 101 does not have a case 7 but may be provided with the case 7. The lead frame LF is bonded on a surface of the insulating member 43 and has the same function as that of the circuit pattern 41 of the semiconductor device 100 shown in FIG. 6. It should be noted that although the lead frame LF and the insulating member 43 are bonded in FIG. 7, a metal plate (not shown) may be disposed between the lead frame LF and the insulating member 43.

The sealing material 9 is provided so as to include the semiconductor element 1, the metal film 2, the wire 3, the insulating member 43, the bonding material 6, and the lead frame LF. However, an end portion of the lead frame LF protrudes outside the sealing material 9, the lead frame LF forms electric circuits of the semiconductor element 1 and the wire 3, and the protruding end portion functions as a terminal 8 for connecting to external equipment of the semiconductor device 101.

Next, manufacturing methods of the semiconductor device 100 shown in FIG. 6 and the semiconductor device 101 shown in FIG. 7 will be described. First, the members that form the respective semiconductor devices 100 and 101 are prepared, laminated according to the configurations described above, and bonded to each other. Then, an end portion of the wire 3 is bonded to a surface of the metal film 2 by ultrasonic bonding or the like. Thereafter, the other end portion of the wire 3 is subjected to wedge bonding to an external electrode. The aluminum wire of the embodiment described above is used as the wire 3. Thereafter, a sealing resin is injected to the semiconductor device 100 and cured to form the sealing material 9. In the case of the semiconductor device 101, the lead frame on which the semiconductor element 1 and the like are mounted is placed in a mold, and a sealing resin is injected thereto and cured to form the sealing material 9.

EXAMPLES

Next, examples will be described. The present invention is not limited to the examples below.

A high-purity aluminum metal having a purity of 99.9 mass % or more was prepared. Iron and silicon were added in the amount described in Table 1. Further, gallium and vanadium were added as optional elements in the amount shown in Table 1. The aluminum alloy compositions of these examples are shown in Table 1. The alloy of each of these samples was melted in the atmosphere and then continuously cast to obtain a wire rod. The obtained wire rod was subjected to wire drawing so as to have an intermediate wire diameter of 5 mm, and this wire with the intermediate wire diameter of 5 mm was subjected to an intermediate heat treatment at 400° C. to 560° C. for 60 minutes. Immediately after the elapse of 60 minutes, it was quenched in water at a cooling speed of 25° C./second or more. Thereafter, the wire was subjected to wire drawing so as to have a final wire diameter of 400 μm and lastly subjected to a final heat treatment in a batch furnace between 200° C. and 340° C. for 60 minutes. The aluminum wire that has completed the final heat treatment was rewound on a spool by a rewinding machine at intervals of about 300 m.

Next, the orientation index and the area ratio of precipitated particles of each of the samples of the examples were obtained.

(Measurement of Wire Orientation Index)

Sampling was performed at three positions of a tip portion, a rear end portion, and a periphery of the middle between the tip and the rear end (middle portion) of the sample wire rewound to about 300 m. Each sample were embedded in a resin such that each lateral cross-section in the direction perpendicular to the wire axis was exposed approximately perpendicular to the wire axis. This resin with the wire embedded therein was roughly polished with sandpaper so as to expose the lateral cross-section on the surface, then after finally being subjected to mirror-finishing by buffing, each part was measured with an X-ray diffractometer (SmartLab manufactured by Rigaku Corporation). A certain amount of wire cross-sectional area is required to obtain the intensity of X-ray diffraction, and thus only one sample having a wire diameter of 400 μm may be insufficient in intensity. Accordingly, for each measurement, about forty wires were bundled to be brought into close contact with each other, embedded, polished, and subjected to X-ray diffraction.

It was performed under the analysis conditions as follows: an X-ray generating portion with a Cu anticathode, output 45 kV, and 200 mA; a semiconductor detector as a detecting portion; a parallel beam method (slit collimation) as an incident optical system; the incident side of the solar slit at 5° and the light receiving side at 5° as well; the incident side of the slit IS=1 mm; a longitudinal limit of 2 mm; and on the light receiving side, RS1=1 mm and RS2=2 mm. The scanning conditions were as follows: a scanning axis of 2

θ/ω, continuous scanning as a scanning mode, a scanning range of 30 to 100°, a step width of 0.02°, and a scanning speed of 3°/minute.

Diffraction intensities (peak separation) of (111), (200), (220), (311), (222), and (400) of each sample were measured to obtain the respective orientation indexes by means of the Wilson's formula.

The orientation indexes of (111) and (200) indicating particularly characteristic tendencies in the examples are shown in Table 1 together with the alloy compositions. It should be noted that the orientation index described in Table 1 is the average value of three parts of the tip, the rear end, and the middle portion of the wire, each of which has five sample windings (five windings×three parts, that is, the average value of a total of fifteen parts). It should be noted that, as described above, the peripheral portion of each part is cut into forty pieces, and the forty pieces are bundled for measurement.

(Measurement of Area Ratio of Precipitated Particles)

Regarding grain diameters of precipitated particles at the tip portion, rear end portion, and intermediate portion of the wire having a final wire diameter of 400 μm and obtained after the solution treatment, an image of the lateral cross-section in the direction perpendicular to the wire axis was taken with an FE-SEM (a field emission scanning electron microscope, JSM-7800F manufactured by JEOL) at an observation magnification of 400 times. However, only about each of four divisions of the slice section was included in the imaging range at the 400 magnifications; accordingly, an image of the wire cross-section was taken in four divisions, and the taken images were pasted together to obtain the area occupied by the precipitated particles relative to the entire slice section. It was performed under the SEM imaging conditions in which the accelerating voltage was set to 5 kV, the working distance (W. D.) was set to 10 mm, and a reflection electron image (BED-C) was selected. In the image analysis, the brightness value of the taken SEM image was normalized in a range of 0 to 1 and binarized with a threshold of 0.95, and e areas with a brightness value higher than the threshold was defined as precipitated particles.

Further, in the image analysis, pixels adjacent to each other in eight neighbors in the region on the image recognized as particles were calculated as one particle. The eight neighbors mean eight directions around a center that predetermined region recognized as particles, its up, down, left, and right, and rotated each of them 45°, and a region in contact with the predetermined region in any of these eight directions is defined as one particle.

Figure 1:
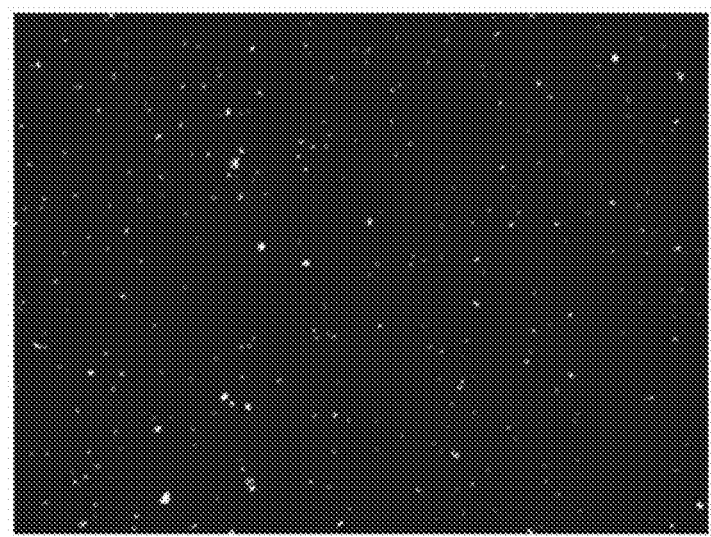
FIG. 1 is a photograph of a cross-section of an aluminum wire of Example 12 which is taken with an FE-SEM at a magnification of 1000 times and binarized with image analysis so that areas where the brightness value is higher than the threshold are shown as white and areas where the brightness value is lower than the threshold are shown as black. The white part represents precipitated particles.
Figure 2:
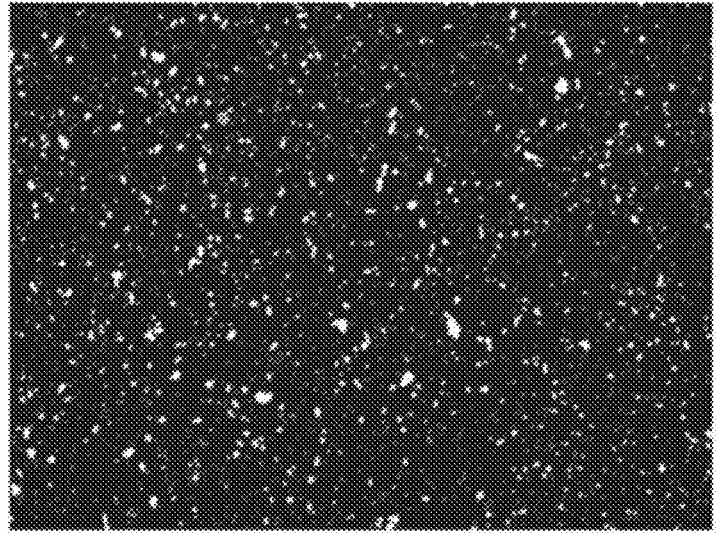
FIG. 2 is a photograph showing precipitated particles of an aluminum wire of Comparative Example 6 which is taken and binarized in the same manner as in FIG. 1.
Figure 3A:
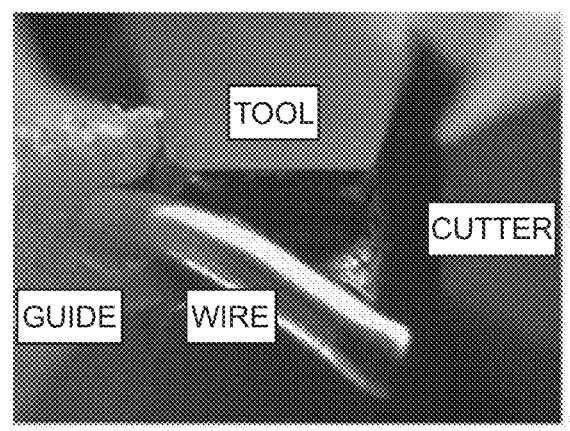
FIG. 3 shows a photograph (left side) taken by enlarging a wedge tool portion of a wire in which the wedge tool become detached, and a normal photograph (right side) in which the wedge tool is not detached.
Figure 3A:
Figure 3B:
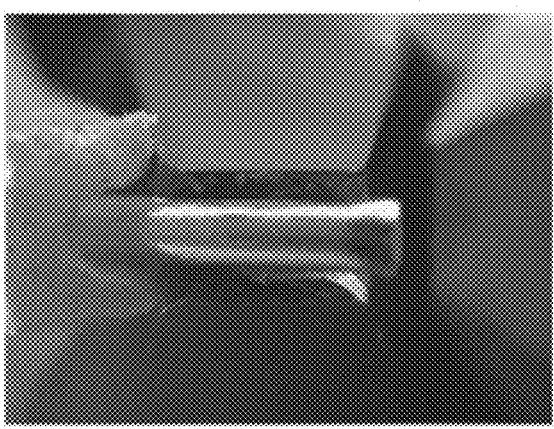

Next, the ratio of the entire cross-section perpendicular to the wire axial direction to the cross-sectional area was expressed as a percentage. The area ratio of the precipitated particles was substantially the same in all of the tip portion, rear end portion, and intermediate portion of the wire. The area ratio of the precipitated particles in each of the examples is shown in Table 1. Precipitated particles of Example 12 are shown in FIG. 1, and precipitated particles of Comparative Example 6 described later are shown in FIG. 2. However, FIGS. 1 and 2 are photographs obtained by, with the image analysis, binarizing images taken at a magnification of 1000 times so that the precipitated particles can be identified more easily. The areas in white show precipitated particles.

TABLE 1

| | | WIRE PROPERTIES | | | | | | | | |
| | | WIRE COMPOSITIONS | | | | ORIEN-TATION INDEX | | AREA RATIO OF PRECIPITATED PARTICLES PERCENTAGE | WIRE EVALUATION | | | |
| | | Al MASS | Fe + Si MASS | Ga + V MASS | OTHERS MASS | | | | LIFE TEST | TOOL DETACH-MENT | HEAT GENER-ATION | OVERALL EVALUATION |
| | No. | % | % | ppm | ppm | (111) | (200) | % | | | | |
| EXAM-PLES | 1 | 90.09 | 0.9 | 52 | 48 | 1.78 | 0.43 | 1.9 | S | A | S | EXCELLENT |
| | 2 | 99.09 | 0.9 | 52 | 48 | 1.23 | 0.75 | 1.8 | S | A | S | EXCELLENT |
| | 3 | 99.09 | 0.9 | 52 | 48 | 1.25 | 0.62 | 1.6 | S | A | S | EXCELLENT |
| | 4 | 99.09 | 0.9 | 52 | 48 | 1.31 | 0.81 | 1.3 | S | A | S | EXCELLENT |
| | 5 | 99.09 | 0.9 | 52 | 48 | 1.62 | 0.12 | 1.7 | S | A | S | EXCELLENT |
| | 6 | 99.09 | 0.9 | 52 | 48 | 1.9 | 0.22 | 1 | S | A | S | EXCELLENT |
| | 7 | 99.09 | 0.9 | 52 | 48 | 1.35 | 0.69 | 1.5 | S | A | S | EXCELLENT |
| | 8 | 99.09 | 0.9 | 52 | 48 | 1.95 | 0.29 | 1.7 | S | A | S | EXCELLENT |
| | 9 | 99.8 | 0.11 | 785 | 115 | 1.82 | 0.32 | 1.2 | S | A | S | EXCELLENT |
| | 10 | 99.8 | 0.11 | 785 | 115 | 1.32 | 0.56 | 1 | S | A | S | EXCELLENT |
| | 11 | 99.8 | 0.11 | 785 | 115 | 1.51 | 0.54 | 1.3 | S | A | S | EXCELLENT |
| | 12 | 99.8 | 0.11 | 785 | 115 | 1.47 | 0.55 | 0.3 | S | A | S | EXCELLENT |
| | 13 | 99.8 | 0.11 | 785 | 115 | 1.77 | 0.28 | 0.9 | S | A | S | EXCELLENT |
| | 14 | 99.8 | 0.11 | 785 | 115 | 1.66 | 0.45 | 0.2 | S | A | S | EXCELLENT |
| | 15 | 99.8 | 0.11 | 785 | 115 | 1.34 | 0.97 | 0.5 | S | A | S | EXCELLENT |
| | 16 | 99.8 | 0.11 | 785 | 115 | 1.66 | 0.43 | 0.6 | S | A | S | EXCELLENT |
| | 17 | 99.44 | 0.55 | 46 | 54 | 1.81 | 0.55 | 0.5 | A | A | S | GOOD |
| | 18 | 99.44 | 0.55 | 46 | 54 | 1.33 | 0.86 | 1.6 | A | A | S | GOOD |
| | 19 | 99.44 | 0.55 | 46 | 54 | 1.23 | 0.68 | 1.8 | A | A | S | GOOD |
| | 20 | 99.44 | 0.55 | 46 | 54 | 1.1 | 0.74 | 0.6 | A | A | S | GOOD |
| | 21 | 99.44 | 0.55 | 46 | 54 | 1.67 | 0.29 | 1.3 | A | A | S | GOOD |
| | 22 | 99.44 | 0.55 | 46 | 54 | 1.51 | 0.44 | 1 | A | A | S | GOOD |
| | 23 | 99.44 | 0.55 | 46 | 54 | 1.33 | 0.57 | 0.8 | A | A | S | GOOD |
| | 24 | 99.44 | 0.55 | 46 | 54 | 1.56 | 0.4 | 1.1 | A | A | S | GOOD |
| | 25 | 99.28 | 0.63 | 820 | 80 | 1.39 | 0.48 | 1.4 | S | A | A | GOOD |
| | 26 | 99.28 | 0.63 | 820 | 80 | 1.1 | 0.88 | 1.5 | S | A | A | GOOD |
| | 27 | 99.28 | 0.63 | 820 | 80 | 1.32 | 0.66 | 1.7 | S | A | A | GOOD |
| | 28 | 99.28 | 0.63 | 820 | 80 | 1.45 | 0.71 | 1.5 | S | A | A | GOOD |
| | 29 | 99.28 | 0.63 | 820 | 80 | 1.88 | 0.07 | 1.8 | S | A | A | GOOD |

TABLE 1-continued

| | WIRE PROPERTIES | | | | | | | | |
| | WIRE COMPOSITIONS | | | | ORIEN- | AREA RATIO OF PRECIPITATED | WIRE EVALUATION | | |
| | Al MASS | Fe + Si MASS | Ga + V MASS | OTHERS MASS | TATION INDEX | PARTICLES PERCENTAGE | LIFE | TOOL DETACH- | HEAT GENER- | OVERALL |
| No. | % | % | ppm | ppm | (111)    (200) | % | TEST | MENT | ATION | EVALUATION |
|---|---|---|---|---|---|---|---|---|---|---|
| 30 | 99.28 | 0.63 | 820 | 80 | 1.64    0.21 | 1.4 | S | A | A | GOOD |
| 31 | 99.28 | 0.63 | 820 | 80 | 1.32    0.65 | 1.3 | S | A | A | GOOD |
| 32 | 99.28 | 0.63 | 820 | 80 | 1.99    0.55 | 0.9 | S | A | A | GOOD |

(Tool Detachment Evaluation 1)

Next, each sample in which a wire diameter of the aluminum wire is 400 µm was bonded to an aluminum plate using an ultrasonic bonding device (a wire bonder, ASTE-RION, manufactured by K&S) so that the distance between the first bonding and the second bonding was 5 mm. The second bonding portion was bent to the side horizontally with respect to the wire axial direction at a target angle of 45° (see FIG. 4, in which in the lower left photograph, it was bent at only about) 30°. The bonding conditions were set such that the ultrasonic energy and the pressure were optimal for each sample. It should be noted that a bond tool, model number 127591-16 manufactured by Kulicke & Soffa, was used, and the dimensions of the alligator for gripping the wire were a frontage (inner diameter) of 0.5 mm, a height of 0.2 mm, and a length of 1.0 mm.

For each sample, whether a failure of tool detachment has occurred was determined by observing the state of the wire at the second bonding part. Each sample was subjected to the bonding 30 times (a combination of the first bonding and the second bonding is regarded as 1 time), and a wire that caused a bonding failure or had even one contact mark with a tool that made a one-sided contact therewith as shown in the lower left of FIG. 4 was graded fail and rated as "C". As in the lower right of FIG. 4, if the bonding was normally made, it was graded pass and rated as "A", which was shown in Table 1 as a tool detachment evaluation.

Figure 4:
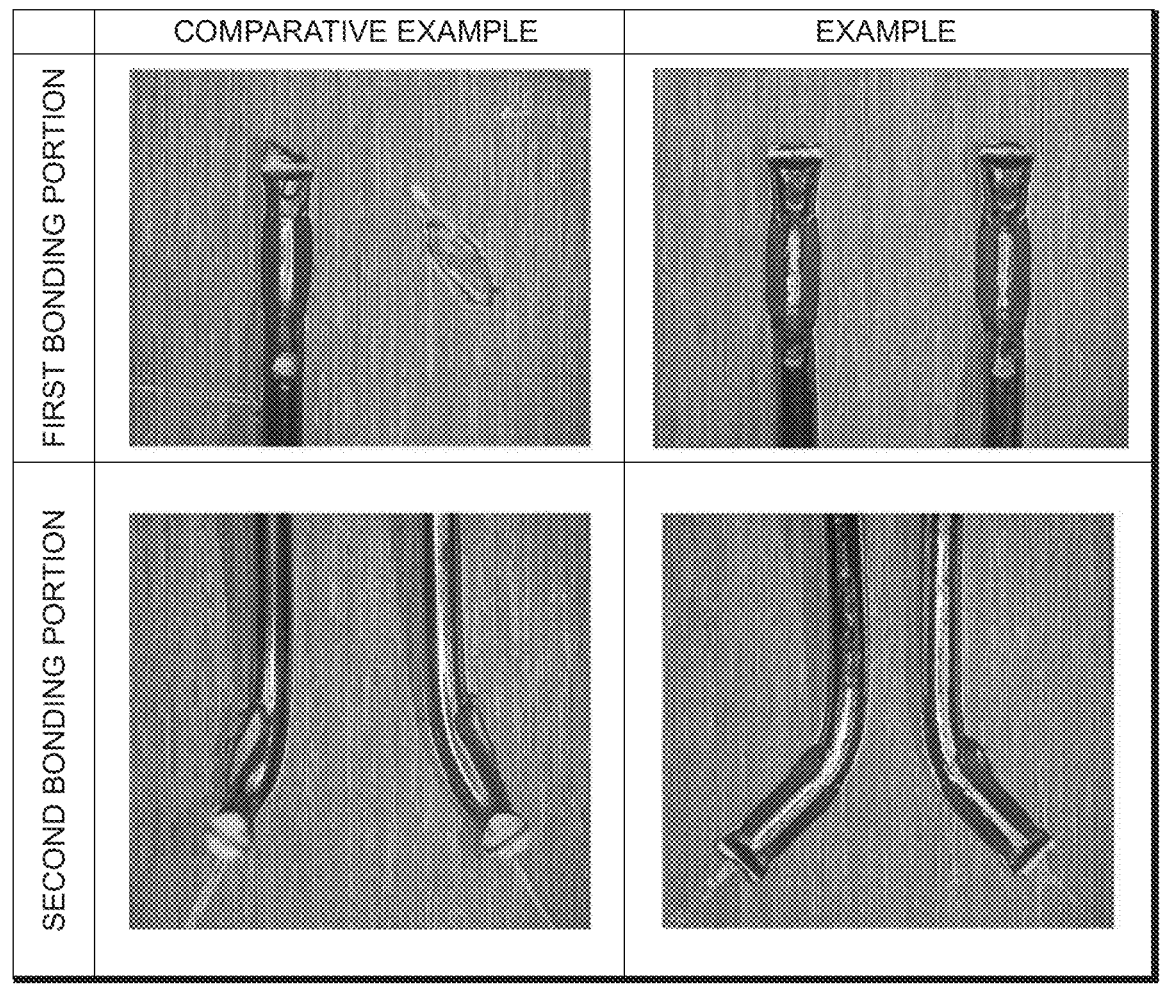
FIG. 4 shows bonding photographs of aluminum wires in a comparative example and an example.

The two upper and lower photographs on the right side of FIG. 4 were obtained from Example 1. The upper right figure shows the wire after the first bonding by ultrasonic waves, and the lower right figure shows the wire obtained by being bent to the side at 45° horizontally with respect to the longitudinal direction of the wire after the first bonding and then subjected to the second bonding. As apparent from both of the photographs, it can be seen that the bonding was normally performed without any contact mark or the like.

(Power Cycle Test Evaluation)

Each sample in which a wire diameter of the aluminum wire is 400 µm was bonded to a power chip in which nickel was metallized on an aluminum alloy electrode on the surface (a metal film was formed on the surface), using an ultrasonic bonding device (a wire bonder, REBO9, manufactured by Ultrasonic Engineering). In the bonding conditions, the ultrasonic energy and the pressure were set such that the wire width after bonding was 500 µm for each sample. The current, the energization time, and the cooling time were set such that a maximum temperature of the power chip was 150° C. and a minimum temperature thereof was 50° C., that is, $\Delta T=100°$ C., then a power cycle test was performed. It was performed for about 20 seconds per one cycle in which the energization time at this time was about 7 seconds and the energization stop time was about 13 seconds.

The number of cycles in which the potential difference between the front and back electrodes of the power chip at the time of energization increased by 5% from the initial value was defined as a life in the power cycle test. A sample with a life of 200,000 cycles or more was regarded as having a life equal to or more than the target and denoted by "S". A sample with a life of 100,000 cycles or more and less than 200,000 cycles was regarded as a target level and denoted by "A". A sample with a life of 50,000 cycles or more and less than 100,000 cycles was regarded as a passing mark and denoted by "B". A sample with a life of less than 50,000 cycles was regarded as fail and denoted by "C". Table 1 shows the evaluation of the power cycle test of the aluminum wire in each example.

(Measurement 1 of Residual Resistance Ratio) (Heat Generation)

The residual resistance ratio (RRR) is expressed by the ratio of the electric resistance in liquid helium at 4.2 K (kelvin) and the electric resistance at room temperature of 300 K. The manufactured aluminum wire was cut into a length of 15 cm and measured the electric resistance. All of the electric resistances were measured by a four-terminal method, and after each electric resistance was measured, the ratio of the electric resistances was calculated. It should be noted that since the residual resistance ratio is proportional to the temperature rise at the time of energization, if a residual resistance value was 10 or more and less than 15, which allows to suppress the temperature rise so as to be less than 30° C. from the maximum temperature of the aluminum wire having a purity of 99.99 mass % described above, so it was denoted by "A". If a residual resistance value is 15 or more, which allows to suppress the temperature rise so as to be 10° C. or less, so it was denoted by "S" in the sense that it is even better, in the column of the wire evaluation in Table 1. Further, a temperature rise of 30° C. or more was graded fail and evaluated as "C".

(Overall Evaluation 1)

A sample in which the above three evaluations were two "S" and one "A" was determined as "Excellent" in the overall evaluation in the sense that it is superior. A sample with one "S" and two "A" was determined as "Good" in the overall evaluation in the sense that it is good. A sample with the other evaluation combination and no "C" was determined as "Fair" in the overall evaluation in the sense that it is a passing mark. A sample with even one "C" was determined as "Poor" in the overall evaluation in the sense that it is fail. Then each evaluation was described in Table 1.

Next, aluminum wires of Example 33 and the subsequent examples having a final wire diameter of 400 μm were obtained in the same manner as in Example 1, except that the composition of the aluminum wire was adjusted as shown in Tables 2 to 13, and the manufacturing such as conditions the intermediate wire diameter, intermediate heat treatment conditions, and final heat treatment conditions were adjusted within the range of the above embodiment. For these aluminum wires, the orientation index and the area ratio of the precipitated particles were measured in the same manner as in Example 1, then the wire properties were evaluated. It should be noted that for Example 33 and the subsequent examples, the criteria of tool detachment evaluation, heat generation (residual resistance ratio) evaluation, and overall evaluation were set more specifically than those for Examples 1 to 32 described above, as in the following "Tool Detachment Evaluation 2", "Measurement 2 of Residual Resistance Ratio", and "Overall Evaluation 2". The notation of "-" in each table indicates that it is less than the lower limit of measurement.

(Tool Detachment Evaluation 2)

The tool detachment test was performed in the same manner as in "Tool Detachment Evaluation 1" described above, and the evaluation was as follows. Whether a failure of tool detachment has occurred was determined by observing the state of the wire at the second bonding part. Each sample was subjected to the bonding 100 times (a combination of the first bonding and the second bonding is regarded as 1 time), and tool detachment was evaluated as follows: a wire that caused a bonding failure or had four or more contact marks with a tool that made a one-sided contact therewith as shown in the lower left of FIG. 4 was graded fail and rated as "C", a wire having two to three contact marks is desired to be slightly improved but has no practical problem so that rated as "B", a wire having one contact mark is very excellent and thus was graded pass so that rated as "A", and a wire having no contact mark at all was rated as "S".

(Measurement 2 of Residual Resistance Ratio) (Heat Generation)

The residual resistance ratio (RRR) test was performed in the same manner as in "Measurement 1 of Residual Resistance Ratio" described above, and the evaluation criteria were changed as follows. The residual resistance ratio is proportional to the temperature rise at the time of energization. A residual resistance value being 15 or more it allows to suppress the temperature rise so as to be 10° C. or less from the maximum temperature which the aluminum wire having a purity of 99.99 mass % described above is assumed to reach, so that was evaluated as "S" in the sense that it is very excellent. A case that the temperature rise can be suppressed exceeding 10° C. so as to be 20° C. or less was evaluated as "A". A case that the temperature rise can be suppressed exceeding 20° C. so as to be less than 30° C. was evaluated as "B". A case that a temperature rise to 30° C. or more was graded fail and thus evaluated as "C".

(Overall Evaluation 2)

A sample in which "S" was one or more and the other was "S" or "A" in the above three evaluations was determined as "Excellent" in the overall evaluation in the sense that it is superior, a sample with a total of two or more of "A" and "S" was determined as "Good" in the overall evaluation in the sense that it is good, a sample with two or more "B" and no "C" was determined as "Fair" in the overall evaluation in the sense that it is a passing mark, and a sample with even one "C" was determined as "Poor" in the overall evaluation in the sense that it is fail, then each evaluation was described in the table.

Specific combinations for each evaluation (in any order) are as follows.

"Excellent": SSS, SSA, SAA

"Good": SAB, SSB, AAB, AAA

"Fair": SBB, ABB, BBB

"Poor": a case of having even one C

The above results are shown in Tables 2 to 13 together with the compositions.

TABLE 2

| EXAMPLE No. | Al (MASS %) | Fe + Si (MASS %) | DETAILS Fe | DETAILS Si | Fe/Si MASS RATIO | Ga + V (MASS ppm) | DETAILS Ga | DETAILS V | TRACE ELEMENTS (MASS ppm) | DETAILS Mg | DETAILS Cu | DETAILS Ni | DETAILS Zn | DETAILS Cr | DETAILS Mn | DETAILS Ti |
|---|---|---|---|---|---|---|---|---|---|---|---|---|---|---|---|---|
| 33 | 99.03 | 0.92 | 0.6 | 0.32 | 1.9 | 401 | 300 | 101 | 100 | — | 10 | 30 | — | 5 | — | 15 |
| 34 | 99.47 | 0.48 | 0.39 | 0.09 | 4.3 | 450 | 320 | 130 | 100 | — | 10 | 30 | — | 5 | — | 15 |
| 35 | 99.75 | 0.19 | 0.15 | 0.04 | 3.6 | 510 | 320 | 190 | 100 | — | 10 | 30 | — | 5 | — | 15 |
| 36 | 99.13 | 0.85 | 0.67 | 0.18 | 3.7 | 105 | 56 | 49 | 110 | 10 | 13 | 30 | — | 5 | — | 15 |
| 37 | 99.55 | 0.43 | 0.39 | 0.04 | 9.8 | 120 | 100 | 20 | 105 | 10 | 10 | 30 | — | 5 | — | 10 |
| 38 | 99.80 | 0.17 | 0.12 | 0.05 | 2.4 | 152 | 100 | 52 | 100 | 10 | 5 | 30 | — | 5 | — | 10 |
| 39 | 99.10 | 0.88 | 0.51 | 0.37 | 1.4 | 68 | 30 | 36 | 110 | 20 | 5 | 30 | — | 5 | — | 10 |
| 40 | 99.57 | 0.41 | 0.32 | 0.09 | 3.6 | 90 | 70 | 20 | 110 | 20 | 5 | 30 | — | 5 | — | 10 |
| 41 | 99.83 | 0.15 | 0.11 | 0.04 | 2.6 | 77 | 67 | 10 | 125 | 30 | 5 | 30 | — | 5 | — | 15 |
| 42 | 99.39 | 0.55 | 0.45 | 0.1 | 4.5 | 444 | 400 | 44 | 125 | 30 | 5 | 30 | — | 5 | — | 15 |
| 43 | 99.56 | 0.39 | 0.3 | 0.09 | 3.3 | 422 | 400 | 22 | 120 | 25 | 5 | 30 | — | 5 | — | 15 |
| 44 | 99.75 | 0.18 | 0.1 | 0.08 | 1.3 | 621 | 600 | 21 | 120 | 25 | 5 | 30 | — | 5 | — | 15 |
| 45 | 99.32 | 0.66 | 0.6 | 0.06 | 10.0 | 112 | 100 | 12 | 135 | 40 | 5 | 30 | — | 5 | — | 15 |
| 46 | 99.75 | 0.22 | 0.2 | 0.02 | 10.0 | 130 | 100 | 30 | 125 | 40 | 5 | 30 | — | 5 | — | 5 |
| 47 | 99.77 | 0.19 | 0.11 | 0.08 | 1.4 | 300 | 250 | 50 | 115 | 30 | 5 | 30 | — | 5 | — | 5 |
| 48 | 99.41 | 0.57 | 0.34 | 0.23 | 1.5 | 66 | 50 | 16 | 100 | 15 | 5 | 30 | — | 5 | — | 5 |
| 49 | 99.05 | 0.33 | 0.23 | 0.1 | 2.3 | 78 | 40 | 38 | 100 | 15 | 5 | 30 | — | 5 | — | 5 |
| 50 | 99.96 | 0.02 | 0.01 | 0.01 | 1.0 | 99 | 50 | 49 | 105 | 20 | 5 | 30 | — | 5 | — | 5 |
| 51 | 99.12 | 0.02 | 0.8 | 0.02 | 40.0 | 449 | 400 | 49 | 105 | 20 | 5 | 30 | — | 5 | — | 5 |
| 52 | 99.85 | 0.24 | 0.21 | 0.03 | 7.0 | 980 | 950 | 30 | 110 | 15 | 5 | 30 | — | 5 | — | 5 |
| 53 | 99.76 | 0.17 | 0.15 | 0.02 | 7.5 | 567 | 450 | 117 | 95 | — | 5 | 30 | — | 5 | — | 5 |
| 54 | 99.08 | 0.88 | 0.87 | 0.01 | 87.0 | 258 | 240 | 18 | 105 | — | 5 | 30 | — | 5 | — | 15 |
| 55 | 99.61 | 0.35 | 0.3 | 0.05 | 0.0 | 298 | 200 | 98 | 105 | — | 5 | 30 | — | 5 | — | 15 |

TABLE 2-continued

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENER-ATION | OVERALL EVALUATION |
|---|---|---|---|---|---|---|---|---|---|---|---|
| 33 | 10 | — | 10 | 20 | 1.52 | 0.01 | 1.97 | S | B | B | FAIR |
| 34 | 10 | — | 10 | 20 | 1.57 | 0.02 | 0.93 | S | A | B | GOOD |
| 35 | 10 | — | 10 | 20 | 1.6 | 0.03 | 0.42 | A | S | A | EXCELLENT |
| 36 | 10 | — | 10 | 20 | 1.87 | 0.04 | 1.78 | S | B | B | FAIR |
| 37 | 10 | — | 10 | 20 | 1.76 | 0.02 | 0.96 | S | A | A | EXCELLENT |
| 38 | 10 | — | 10 | 20 | 1.67 | 0.03 | 0.31 | B | S | S | GOOD |
| 39 | 10 | — | 10 | 20 | 1.56 | 0.05 | 1.72 | S | B | B | FAIR |
| 40 | 10 | — | 10 | 20 | 1.53 | 0.06 | 0.86 | A | A | S | EXCELLENT |
| 41 | 10 | — | 10 | 20 | 1.92 | 0.08 | 0.35 | B | S | S | GOOD |
| 42 | 10 | — | 10 | 20 | 1.43 | 0.07 | 1.12 | S | B | B | FAIR |
| 43 | 10 | — | 10 | 20 | 1.41 | 0.03 | 0.9 | A | S | A | EXCELLENT |
| 44 | 10 | — | 10 | 20 | 1.4 | 0.03 | 0.44 | B | S | A | GOOD |
| 45 | 10 | — | 10 | 20 | 1.48 | 0.01 | 1.36 | A | B | B | FAIR |
| 46 | 10 | — | 10 | 20 | 1.25 | 0.01 | 0.5 | B | S | S | GOOD |
| 47 | 10 | — | 10 | 20 | 1.29 | 0.02 | 0.44 | B | S | S | GOOD |
| 48 | 10 | — | 10 | 20 | 1.35 | 0.02 | 1.18 | A | B | A | GOOD |
| 49 | 10 | — | 10 | 20 | 1.44 | 0.03 | 0.73 | B | S | S | GOOD |
| 50 | 10 | — | 10 | 20 | 1.42 | 0.06 | 0.02 | B | S | S | GOOD |
| 51 | 10 | — | 10 | 20 | 1.01 | 0.05 | 1.73 | A | B | B | FAIR |
| 52 | 10 | — | 20 | 20 | 1.18 | 0.01 | 0.56 | B | S | B | FAIR |
| 53 | 10 | — | 20 | 20 | 1.17 | 0.02 | 0.42 | B | S | A | GOOD |
| 54 | 10 | — | 20 | 20 | 1.12 | 0.02 | 1.87 | A | B | B | FAIR |
| 55 | 10 | — | 20 | 20 | 1.11 | 0.04 | 0.88 | B | S | S | GOOD |

TABLE 3

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 56 | 99.84 | 0.12 | 0.1 | 0.02 | 5.0 | 320 | 240 | 80 | 105 | 1 | 5 | 30 | — | 5 | — | 15 |
| 57 | 99.13 | 0.86 | 0.2 | 0.66 | 0.3 | — | — | — | 110 | 5 | 5 | 30 | — | 5 | — | 15 |
| 58 | 99.73 | 0.25 | 0.1 | 0.15 | 0.7 | 66 | 40 | 26 | 130 | 20 | 5 | 30 | — | 10 | — | 15 |
| 59 | 99.84 | 0.14 | 0.12 | 0.02 | 6.0 | 96 | 50 | 46 | 110 | 15 | 5 | 30 | — | 10 | — | — |
| 60 | 99.20 | 0.75 | 0.5 | 0.25 | 2.0 | 411 | 300 | 111 | 115 | 15 | 10 | 30 | — | 10 | — | — |
| 61 | 99.63 | 0.3 | 0.2 | 0.1 | 2.0 | 578 | 400 | 178 | 130 | 30 | 10 | 30 | — | 10 | — | — |
| 62 | 99.72 | 0.17 | 0.12 | 0.05 | 2.4 | 990 | 50 | 940 | 133 | 30 | 10 | 30 | — | 10 | 3 | — |
| 63 | 99.39 | 0.58 | 0.56 | 0.02 | 28.0 | 159 | 100 | 59 | 138 | 35 | 10 | 30 | — | 10 | 3 | — |
| 64 | 99.63 | 0.34 | 0.33 | 0.01 | 33.0 | 200 | 100 | 100 | 138 | 35 | 10 | 30 | — | 10 | 3 | — |
| 65 | 99.77 | 0.19 | 0.12 | 0.07 | 1.7 | 280 | 200 | 80 | 139 | 36 | 10 | 30 | — | 10 | 3 | — |
| 66 | 99.47 | 0.51 | 0.4 | 0.11 | 3.6 | 78 | 50 | 28 | 143 | 40 | 10 | 30 | — | 10 | 3 | — |
| 67 | 99.51 | 0.47 | 0.4 | 0.07 | 5.7 | 48 | 30 | 18 | 126 | 23 | 10 | 30 | — | 10 | 3 | — |
| 68 | 99.78 | 0.2 | 0.1 | 0.1 | 1.0 | 89 | 80 | 9 | 141 | 23 | 10 | 30 | — | 10 | 3 | 15 |
| 69 | 99.28 | 0.65 | 0.6 | 0.05 | 12.0 | 589 | 400 | 189 | 138 | 20 | 10 | 30 | — | 10 | 3 | 15 |
| 70 | 99.51 | 0.4 | 0.3 | 0.1 | 3.0 | 767 | 600 | 167 | 140 | 17 | 15 | 30 | — | 10 | 3 | 15 |
| 71 | 99.78 | 0.17 | 0.1 | 0.07 | 1.4 | 407 | 300 | 107 | 142 | 19 | 15 | 30 | — | 10 | 3 | 15 |
| 72 | 99.09 | 0.88 | 0.8 | 0.08 | 10.0 | 129 | 100 | 29 | 124 | 21 | 15 | 10 | — | 10 | 3 | 15 |
| 73 | 99.61 | 0.35 | 0.3 | 0.05 | 6.0 | 289 | 200 | 89 | 114 | 11 | 15 | 10 | — | 10 | 3 | 15 |
| 74 | 99.80 | 0.16 | 0.1 | 0.06 | 1.7 | 222 | 200 | 22 | 137 | 39 | 15 | 10 | — | 10 | 3 | 10 |
| 75 | 99.38 | 0.6 | 0.55 | 0.05 | 11.0 | 41 | 30 | 11 | 132 | 34 | 15 | 10 | — | 10 | 3 | 10 |

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENER-ATION | OVERALL EVALUATION |
|---|---|---|---|---|---|---|---|---|---|---|---|
| 56 | 10 | — | 20 | 20 | 1 | 0.05 | 0.3 | B | S | S | GOOD |
| 57 | 10 | — | 20 | 20 | 1.06 | 0.08 | 1.72 | B | B | B | FAIR |
| 58 | 10 | — | 20 | 20 | 1.19 | 0.09 | 0.55 | B | S | S | GOOD |
| 59 | 10 | — | 20 | 20 | 1.16 | 0.03 | 0.38 | B | S | S | GOOD |
| 60 | 10 | — | 20 | 20 | 1.52 | 0.4 | 1.57 | S | B | B | FAIR |
| 61 | 10 | — | 20 | 20 | 1.67 | 0.32 | 0.78 | A | S | A | EXCELLENT |
| 62 | 10 | — | 20 | 20 | 1.69 | 0.15 | 0.42 | A | S | B | GOOD |

TABLE 3-continued

| No. | Zr | W | Sc | OTHERS | 111 | 200 | PERCENTAGE % | LIFE | TOOL | ATION | EVALUATION |
|---|---|---|---|---|---|---|---|---|---|---|---|
| 63 | 10 | — | 20 | 20 | 1.65 | 0.23 | 1.13 | S | B | B | FAIR |
| 64 | 10 | — | 20 | 20 | 1.55 | 0.19 | 0.8 | A | S | S | EXCELLENT |
| 65 | 10 | — | 20 | 20 | 1.98 | 0.44 | 0.43 | B | S | S | GOOD |
| 66 | 10 | — | 20 | 20 | 1.88 | 0.32 | 1.06 | A | B | A | GOOD |
| 67 | 10 | — | 20 | 20 | 1.9 | 0.21 | 1 | B | A | S | GOOD |
| 68 | 10 | — | 20 | 20 | 1.6 | 0.23 | 0.6 | B | S | S | GOOD |
| 69 | 10 | — | 20 | 20 | 1.3 | 0.34 | 1.33 | S | B | B | FAIR |
| 70 | 10 | — | 20 | 20 | 1.32 | 0.44 | 0.82 | A | S | A | EXCELLENT |
| 71 | 10 | — | 20 | 20 | 1.34 | 0.47 | 0.56 | B | S | A | GOOD |
| 72 | 10 | — | 20 | 20 | 1.42 | 0.48 | 1.77 | S | B | B | FAIR |
| 73 | 10 | — | 20 | 20 | 1.41 | 0.12 | 0.72 | B | S | S | GOOD |
| 74 | 10 | — | 20 | 20 | 1.47 | 0.34 | 0.32 | B | S | S | GOOD |
| 75 | 10 | — | 20 | 20 | 1.32 | 0.33 | 1.27 | B | B | A | FAIR |

TABLE 4

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 76 | 99.54 | 0.44 | 0.43 | 0.01 | 43.0 | 75 | 60 | 15 | 137 | 39 | 15 | 10 | — | 10 | 3 | 10 |
| 77 | 99.82 | 0.16 | 0.1 | 0.06 | 1.7 | 88 | 80 | 8 | 123 | 20 | 15 | 10 | — | 10 | 3 | 15 |
| 78 | 99.42 | 0.52 | 0.5 | 0.02 | 25.0 | 479 | 400 | 79 | 139 | 36 | 15 | 10 | — | 10 | 3 | 15 |
| 79 | 99.67 | 0.25 | 0.2 | 0.05 | 4.0 | 675 | 500 | 175 | 120 | 12 | 20 | 10 | — | 10 | 3 | 15 |
| 80 | 99.78 | 0.12 | 0.1 | 0.02 | 5.0 | 835 | 500 | 335 | 120 | 12 | 20 | 10 | — | 10 | 3 | 15 |
| 81 | 99.08 | 0.9 | 0.78 | 0.12 | 6.5 | 108 | 60 | 48 | 142 | 34 | 20 | — | 10 | 10 | 3 | 15 |
| 82 | 99.65 | 0.31 | 0.23 | 0.08 | 2.9 | 267 | 200 | 67 | 147 | 39 | 20 | — | 10 | 10 | 3 | 15 |
| 83 | 99.78 | 0.18 | 0.12 | 0.06 | 2.0 | 300 | 200 | 100 | 145 | 37 | 20 | — | 10 | 10 | 3 | 15 |
| 84 | 99.32 | 0.66 | 0.55 | 0.11 | 5.0 | 67 | 50 | 17 | 128 | 20 | 20 | — | 10 | 10 | 3 | 15 |
| 85 | 99.61 | 0.37 | 0.32 | 0.05 | 6.4 | 76 | 50 | 28 | 128 | 20 | 20 | — | 10 | 10 | 3 | 15 |
| 86 | 99.82 | 0.16 | 0.12 | 0.04 | 3.0 | 98 | 50 | 48 | 118 | 5 | 25 | — | 10 | 10 | 3 | 15 |
| 87 | 99.17 | 0.77 | 0.67 | 0.1 | 6.7 | 467 | 300 | 167 | 118 | 5 | 25 | — | 10 | 10 | 3 | 15 |
| 88 | 99.57 | 0.35 | 0.33 | 0.02 | 16.5 | 666 | 500 | 166 | 128 | 5 | 25 | 10 | 10 | 10 | 3 | 15 |
| 89 | 99.77 | 0.14 | 0.12 | 0.02 | 6.0 | 742 | 400 | 342 | 128 | 5 | 25 | 10 | 10 | 10 | 3 | 15 |
| 90 | 99.45 | 0.52 | 0.43 | 0.09 | 4.8 | 123 | 100 | 23 | 133 | 5 | 30 | 10 | 10 | 10 | 3 | 15 |
| 91 | 99.55 | 0.42 | 0.3 | 0.12 | 2.5 | 187 | 100 | 87 | 133 | 5 | 30 | 10 | 10 | 10 | 3 | 15 |
| 92 | 99.78 | 0.18 | 0.12 | 0.06 | 2.0 | 278 | 200 | 78 | 133 | 5 | 30 | 10 | 10 | 10 | 3 | 15 |
| 93 | 99.39 | 0.59 | 0.43 | 0.16 | 2.7 | 66 | 40 | 26 | 150 | 35 | 10 | 10 | 10 | 10 | 10 | 15 |
| 94 | 99.76 | 0.22 | 0.2 | 0.02 | 10.0 | 77 | 50 | 27 | 147 | 32 | 10 | 10 | 10 | 10 | 10 | 15 |
| 95 | 99.80 | 0.18 | 0.15 | 0.03 | 5.0 | 97 | 70 | 27 | 125 | 10 | 10 | 10 | 10 | 10 | 10 | 15 |

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENERATION | OVERALL EVALUATION |
|---|---|---|---|---|---|---|---|---|---|---|---|
| 76 | 10 | — | 20 | 20 | 1.36 | 0.48 | 0.92 | B | A | S | GOOD |
| 77 | 10 | — | 20 | 20 | 1.39 | 0.41 | 0.4 | B | S | S | GOOD |
| 78 | 10 | — | 20 | 20 | 1.11 | 0.31 | 1.03 | A | B | B | FAIR |
| 79 | 10 | — | 20 | 20 | 1.16 | 0.17 | 0.52 | B | S | A | GOOD |
| 80 | 10 | — | 20 | 20 | 1.18 | 0.2 | 0.32 | B | S | B | FAIR |
| 81 | 10 | — | 20 | 20 | 1.17 | 0.21 | 1.76 | A | B | B | FAIR |
| 82 | 10 | — | 20 | 20 | 1.12 | 0.22 | 0.68 | B | S | S | GOOD |
| 83 | 10 | — | 20 | 20 | 1.07 | 0.3 | 0.35 | B | S | S | GOOD |
| 84 | 10 | — | 20 | 20 | 1.17 | 0.31 | 1.33 | B | B | A | FAIR |
| 85 | 10 | — | 20 | 20 | 1.12 | 0.4 | 0.71 | B | S | S | GOOD |
| 86 | 10 | — | 20 | 20 | 1.15 | 0.43 | 0.38 | B | S | S | GOOD |
| 87 | 10 | — | 20 | 20 | 1.62 | 0.52 | 1.54 | S | B | B | FAIR |
| 88 | 10 | — | 20 | 20 | 1.65 | 0.52 | 0.71 | A | S | A | EXCELLENT |
| 89 | 10 | — | 20 | 20 | 1.72 | 0.6 | 0.32 | A | S | A | EXCELLENT |
| 90 | 10 | — | 20 | 20 | 1.82 | 0.67 | 1.06 | S | B | B | FAIR |
| 91 | 10 | — | 20 | 20 | 1.66 | 0.8 | 0.83 | S | A | A | EXCELLENT |
| 92 | 10 | — | 20 | 20 | 1.52 | 0.81 | 0.41 | B | S | S | GOOD |
| 93 | 10 | — | 20 | 20 | 1.53 | 0.57 | 1.22 | A | B | A | GOOD |
| 94 | 10 | — | 20 | 20 | 1.68 | 0.62 | 0.45 | B | S | S | GOOD |
| 95 | 10 | — | 20 | 20 | 1.55 | 0.91 | 0.37 | B | S | S | GOOD |

TABLE 5

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 96 | 99.40 | 0.55 | 0.52 | 0.03 | 17.3 | 403 | 300 | 103 | 125 | 10 | 10 | 10 | 10 | 10 | 10 | 15 |
| 97 | 99.45 | 0.48 | 0.45 | 0.03 | 15.0 | 572 | 300 | 272 | 127 | 12 | 10 | 10 | 10 | 10 | 10 | 15 |
| 98 | 99.73 | 0.19 | 0.18 | 0.01 | 18.0 | 656 | 300 | 356 | 122 | 12 | 5 | 10 | 10 | 10 | 10 | 15 |
| 99 | 99.46 | 0.52 | 0.48 | 0.04 | 12.0 | 120 | 70 | 50 | 123 | 13 | 5 | 10 | 10 | 10 | 10 | 15 |
| 100 | 99.07 | 0.3 | 0.21 | 0.09 | 2.3 | 200 | 100 | 100 | 126 | 16 | 5 | 10 | 10 | 10 | 10 | 15 |
| 101 | 99.77 | 0.18 | 0.16 | 0.02 | 8.0 | 388 | 300 | 88 | 134 | 34 | 5 | — | 10 | 10 | 10 | 15 |
| 102 | 99.18 | 0.8 | 0.77 | 0.03 | 25.7 | 67 | 50 | 17 | 130 | 30 | 5 | — | 10 | 10 | 10 | 15 |
| 103 | 99.65 | 0.33 | 0.3 | 0.03 | 10.0 | 70 | 50 | 20 | 128 | 28 | 5 | — | 10 | 10 | 10 | 15 |
| 104 | 99.86 | 0.12 | 0.1 | 0.02 | 5.0 | 99 | 50 | 49 | 133 | 28 | 5 | — | 15 | 10 | 10 | 15 |
| 105 | 99.34 | 0.6 | 0.5 | 0.1 | 5.0 | 423 | 300 | 123 | 131 | 26 | 5 | — | 15 | 10 | 10 | 15 |
| 106 | 99.56 | 0.37 | 0.3 | 0.07 | 4.3 | 567 | 300 | 267 | 131 | 26 | 5 | — | 15 | 10 | 10 | 15 |
| 107 | 99.72 | 0.19 | 0.17 | 0.02 | 8.5 | 766 | 400 | 366 | 143 | 28 | 5 | 10 | 15 | 10 | 10 | 15 |
| 108 | 99.30 | 0.67 | 0.55 | 0.12 | 4.6 | 150 | 100 | 50 | 137 | 22 | 5 | 10 | 15 | 10 | 10 | 15 |
| 109 | 99.52 | 0.44 | 0.34 | 0.1 | 3.4 | 300 | 250 | 50 | 137 | 22 | 5 | 10 | 15 | 10 | 10 | 15 |
| 110 | 99.81 | 0.15 | 0.1 | 0.05 | 2.0 | 250 | 200 | 50 | 149 | 34 | 5 | 10 | 15 | 10 | 10 | 15 |
| 111 | 99.11 | 0.88 | 0.72 | 0.16 | 4.5 | — | — | — | 134 | 19 | 5 | 10 | 15 | 10 | 10 | 15 |
| 112 | 99.67 | 0.31 | 0.3 | 0.01 | 30.0 | 78 | 40 | 38 | 133 | 18 | 5 | 10 | 15 | 10 | 10 | 15 |
| 113 | 99.87 | 0.11 | 0.1 | 0.01 | 10.0 | 96 | 50 | 46 | 137 | 27 | — | 10 | 15 | 10 | 10 | 15 |
| 114 | 99.38 | 0.56 | 0.43 | 0.13 | 3.3 | 478 | 400 | 78 | 142 | 27 | — | 10 | 15 | 10 | 10 | 15 |
| 115 | 99.71 | 0.22 | 0.2 | 0.02 | 10.0 | 507 | 300 | 267 | 145 | 30 | — | 10 | 15 | 10 | 10 | 15 |

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENERATION | OVERALL EVALUATION |
|---|---|---|---|---|---|---|---|---|---|---|---|
| 96 | 10 | — | 20 | 20 | 1.45 | 0.92 | 1.12 | S | B | B | FAIR |
| 97 | 10 | — | 20 | 20 | 1.32 | 0.99 | 0.97 | A | S | A | EXCELLENT |
| 98 | 10 | — | 20 | 20 | 1.3 | 0.55 | 0.4 | B | S | A | GOOD |
| 99 | 10 | — | 20 | 20 | 1.38 | 0.71 | 1.05 | A | B | B | FAIR |
| 100 | 10 | — | 20 | 20 | 1.41 | 0.77 | 0.62 | B | S | S | GOOD |
| 101 | 10 | — | 20 | 20 | 1.28 | 0.82 | 0.41 | B | S | S | GOOD |
| 102 | 10 | — | 20 | 20 | 1.3 | 0.81 | 1.68 | A | B | A | GOOD |
| 103 | 10 | — | 20 | 20 | 1.37 | 0.61 | 0.66 | B | S | S | GOOD |
| 104 | 10 | — | 20 | 20 | 1.42 | 0.66 | 0.23 | B | S | S | GOOD |
| 105 | 10 | — | 20 | 20 | 1.07 | 0.68 | 1.21 | B | B | B | FAIR |
| 106 | 10 | — | 20 | 20 | 1.12 | 0.69 | 0.76 | B | S | A | GOOD |
| 107 | 10 | — | 20 | 20 | 1.05 | 0.81 | 0.43 | B | S | A | GOOD |
| 108 | 10 | — | 20 | 20 | 1.09 | 0.9 | 1.33 | B | B | A | FAIR |
| 109 | 10 | — | 20 | 20 | 1.12 | 0.92 | 0.87 | B | A | A | GOOD |
| 110 | 10 | — | 20 | 20 | 1.17 | 0.95 | 0.31 | B | S | S | GOOD |
| 111 | 10 | — | 20 | 20 | 1.19 | 0.66 | 1.89 | B | B | B | FAIR |
| 112 | 10 | — | 20 | 20 | 1.16 | 0.7 | 0.67 | B | S | S | GOOD |
| 113 | 10 | — | 20 | 20 | 1.2 | 0.71 | 0.23 | B | S | S | GOOD |
| 114 | 15 | — | 20 | 20 | 1.52 | 0.01 | 1.21 | S | B | B | FAIR |
| 115 | 15 | — | 20 | 20 | 1.59 | 0.02 | 0.45 | A | S | A | EXCELLENT |

TABLE 6

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 116 | 99.74 | 0.16 | 0.12 | 0.04 | 3.0 | 815 | 500 | 315 | 148 | 33 | — | 10 | 15 | 10 | 10 | 15 |
| 117 | 99.27 | 0.7 | 0.6 | 0.1 | 6.0 | 130 | 100 | 30 | 128 | 23 | — | — | 15 | 10 | 10 | 15 |
| 118 | 99.67 | 0.3 | 0.23 | 0.07 | 3.3 | 189 | 100 | 89 | 129 | 29 | — | — | 15 | 10 | 5 | 15 |
| 119 | 99.85 | 0.11 | 0.1 | 0.01 | 10.0 | 298 | 260 | 38 | 128 | 28 | — | — | 15 | 10 | 5 | 15 |
| 120 | 98.98 | 1 | 0.9 | 0.1 | 9.0 | 55 | 39 | 16 | 113 | 13 | — | — | 15 | 10 | 5 | 15 |
| 121 | 99.54 | 0.44 | 0.32 | 0.12 | 2.7 | 89 | 56 | 33 | 128 | 28 | — | — | 15 | 10 | 5 | 15 |
| 122 | 99.84 | 0.14 | 0.12 | 0.02 | 6.0 | 67 | 55 | 12 | 132 | 22 | — | 10 | 15 | 10 | 5 | 15 |
| 123 | 98.94 | 0.99 | 0.88 | 0.11 | 8.0 | 567 | 500 | 67 | 137 | 27 | — | 10 | 15 | 10 | 5 | 15 |
| 124 | 99.44 | 0.48 | 0.45 | 0.03 | 15.0 | 700 | 300 | 400 | 120 | 10 | — | 10 | 15 | 10 | 5 | 15 |
| 125 | 99.73 | 0.18 | 0.1 | 0.08 | 1.3 | 789 | 580 | 209 | 126 | 16 | — | 10 | 15 | 10 | 5 | 15 |
| 126 | 99.09 | 0.88 | 0.85 | 0.03 | 28.3 | 145 | 100 | 45 | 115 | 5 | — | 10 | 15 | 10 | 5 | 15 |
| 127 | 99.75 | 0.22 | 0.2 | 0.02 | 10.0 | 156 | 120 | 36 | 120 | — | 10 | 10 | 15 | 10 | 5 | 15 |

TABLE 6-continued

| No. | Al | Fe+Si | Fe | Si | Fe/Si | Ga+V | Ga | V | Trace | Mg | Cu | Ni | Zn | Cr | Mn | Ti |
|---|---|---|---|---|---|---|---|---|---|---|---|---|---|---|---|---|
| 128 | 99.83 | 0.14 | 0.12 | 0.02 | 8.0 | 178 | 100 | 78 | 160 | 40 | 10 | 10 | 15 | 10 | 5 | 15 |
| 129 | 99.18 | 0.8 | 0.78 | 0.02 | 39.0 | 67 | 30 | 37 | 155 | 35 | 10 | 10 | 15 | 10 | 5 | 15 |
| 130 | 99.65 | 0.33 | 0.3 | 0.03 | 10.0 | 89 | 40 | 49 | 153 | 33 | 10 | 10 | 15 | 10 | 5 | 15 |
| 131 | 99.81 | 0.17 | 0.15 | 0.02 | 7.5 | 99 | 50 | 49 | 138 | 28 | 10 | — | 15 | 10 | 5 | 15 |
| 132 | 99.28 | 0.67 | 0.6 | 0.07 | 8.6 | 409 | 300 | 109 | 139 | 29 | 10 | — | 15 | 10 | 5 | 15 |
| 133 | 99.54 | 0.39 | 0.32 | 0.07 | 4.6 | 578 | 400 | 178 | 119 | 29 | 10 | — | 15 | 10 | 5 | 15 |
| 134 | 99.79 | 0.12 | 0.1 | 0.02 | 5.0 | 798 | 600 | 198 | 111 | 21 | 10 | — | 15 | 10 | 5 | 15 |
| 135 | 99.32 | 0.66 | 0.53 | 0.13 | 4.1 | 129 | 100 | 29 | 115 | 20 | 15 | — | 15 | 10 | 5 | 15 |

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENERATION | OVERALL EVALUATION |
|---|---|---|---|---|---|---|---|---|---|---|---|
| 116 | 15 | — | 20 | 20 | 1.62 | 0.02 | 0.33 | A | S | B | GOOD |
| 117 | 15 | — | 20 | 20 | 1.77 | 0.04 | 1.42 | S | B | B | FAIR |
| 118 | 15 | — | 20 | 20 | 1.84 | 0.01 | 0.65 | A | S | S | EXCELLENT |
| 119 | 15 | — | 20 | 20 | 1.96 | 0.05 | 0.21 | B | S | S | GOOD |
| 120 | 15 | — | 20 | 20 | 1.56 | 0.06 | 1.99 | S | B | B | FAIR |
| 121 | 15 | — | 20 | 20 | 1.55 | 0.07 | 0.92 | A | A | S | EXCELLENT |
| 122 | 15 | — | 20 | 20 | 1.79 | 0.07 | 0.27 | B | S | S | GOOD |
| 123 | 15 | — | 20 | 20 | 1.32 | 0.08 | 1.96 | S | B | B | FAIR |
| 124 | 15 | — | 20 | 20 | 1.37 | 0.09 | 0.92 | A | A | B | GOOD |
| 125 | 15 | — | 20 | 20 | 1.39 | 0.03 | 0.43 | B | S | A | GOOD |
| 126 | 15 | — | 20 | 20 | 1.32 | 0.04 | 1.77 | S | B | B | FAIR |
| 127 | 15 | — | 20 | 20 | 1.37 | 0.05 | 0.43 | B | S | S | GOOD |
| 128 | 15 | — | 20 | 20 | 1.25 | 0.05 | 0.32 | B | S | S | GOOD |
| 129 | 15 | — | 20 | 20 | 1.45 | 0.03 | 1.62 | A | B | A | GOOD |
| 130 | 15 | — | 20 | 20 | 1.44 | 0.02 | 0.86 | B | S | S | GOOD |
| 131 | 15 | — | 20 | 20 | 1.41 | 0.02 | 0.44 | B | S | S | GOOD |
| 132 | 15 | — | 20 | 20 | 1.1 | 0.01 | 1 | A | B | B | FAIR |
| 133 | 15 | — | — | 20 | 1.19 | 0.05 | 0.88 | B | S | A | GOOD |
| 134 | 15 | — | — | 20 | 1.15 | 0.05 | 0.32 | B | S | A | GOOD |
| 135 | 15 | — | — | 20 | 1.12 | 0.06 | 1.3 | A | B | B | FAIR |

TABLE 7

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 136 | 99.51 | 0.45 | 0.44 | 0.01 | 44.0 | 245 | 200 | 45 | 111 | 16 | 15 | — | 15 | 10 | 5 | 15 |
| 137 | 99.78 | 0.18 | 0.16 | 0.02 | 8.0 | 300 | 200 | 100 | 108 | 23 | 15 | 10 | — | 5 | 5 | 15 |
| 138 | 99.30 | 0.69 | 0.6 | 0.09 | 6.7 | 38 | 30 | 8 | 106 | 21 | 15 | 10 | — | 5 | 5 | 15 |
| 139 | 99.70 | 0.28 | 0.23 | 0.05 | 4.6 | 76 | 70 | 6 | 111 | 21 | 15 | 10 | — | 5 | 5 | 15 |
| 140 | 99.86 | 0.12 | 0.1 | 0.02 | 5.0 | 88 | 60 | 28 | 110 | 20 | 15 | 10 | — | 5 | 5 | 15 |
| 141 | 99.39 | 0.55 | 0.44 | 0.11 | 4.0 | 450 | 400 | 50 | 122 | 32 | 15 | 10 | — | 5 | 5 | 15 |
| 142 | 99.55 | 0.38 | 0.32 | 0.06 | 5.3 | 545 | 300 | 245 | 128 | 38 | 15 | 10 | — | 5 | 5 | 15 |
| 143 | 99.72 | 0.19 | 0.12 | 0.07 | 1.7 | 768 | 600 | 166 | 128 | 38 | 15 | 10 | — | 5 | 5 | 15 |
| 144 | 99.39 | 0.59 | 0.43 | 0.16 | 2.7 | 120 | 100 | 20 | 123 | 38 | 15 | 10 | — | 5 | — | 15 |
| 145 | 99.67 | 0.29 | 0.21 | 0.08 | 2.6 | 266 | 100 | 168 | 125 | 40 | 15 | 10 | — | 5 | — | 15 |
| 146 | 99.84 | 0.11 | 0.1 | 0.01 | 10.0 | 345 | 300 | 45 | 125 | 40 | 15 | 10 | — | 5 | — | 15 |
| 147 | 99.22 | 0.76 | 0.73 | 0.03 | 24.3 | 78 | 60 | 18 | 107 | 32 | 10 | 10 | — | 5 | — | 15 |
| 148 | 99.61 | 0.37 | 0.3 | 0.07 | 4.3 | 95 | 60 | 35 | 91 | 16 | 10 | 10 | — | 5 | — | 15 |
| 149 | 99.81 | 0.17 | 0.15 | 0.02 | 7.5 | 68 | 50 | 18 | 103 | 28 | 10 | 10 | — | 5 | — | 15 |
| 150 | 99.39 | 0.55 | 0.5 | 0.05 | 10.0 | 466 | 450 | 16 | 91 | 26 | — | 10 | — | 5 | — | 15 |
| 151 | 99.47 | 0.45 | 0.4 | 0.05 | 8.0 | 700 | 500 | 200 | 86 | 21 | — | 10 | — | 5 | — | 15 |
| 152 | 99.81 | 0.12 | 0.1 | 0.02 | 5.0 | 578 | 500 | 78 | 88 | 20 | — | 10 | 3 | 5 | — | 15 |
| 153 | 99.21 | 0.77 | 0.7 | 0.07 | 10.0 | 123 | 100 | 23 | 88 | 20 | — | 10 | 3 | 5 | — | 15 |
| 154 | 99.48 | 0.49 | 0.43 | 0.06 | 7.2 | 222 | 200 | 22 | 90 | 17 | — | 10 | 3 | 5 | — | 15 |
| 155 | 99.76 | 0.2 | 0.16 | 0.04 | 4.0 | 302 | 250 | 52 | 85 | 17 | — | 10 | 3 | 5 | — | 15 |

TABLE 7-continued

| EXAMPLE No. | Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENER-ATION | OVERALL EVALUATION |
|---|---|---|---|---|---|---|---|---|---|---|---|
| 136 | 15 | — | — | 20 | 1.17 | 0.06 | 1.1 | B | A | A | GOOD |
| 137 | 15 | — | — | 20 | 1.14 | 0.07 | 0.36 | B | S | S | GOOD |
| 138 | 15 | — | — | 20 | 1.18 | 0.08 | 1.39 | B | B | A | FAIR |
| 139 | 15 | — | 5 | 20 | 1.13 | 0.08 | 0.57 | B | S | S | GOOD |
| 140 | 15 | — | 5 | 20 | 1.18 | 0.02 | 0.24 | B | S | S | GOOD |
| 141 | 15 | — | 5 | 20 | 1.52 | 0.12 | 1.2 | S | B | B | FAIR |
| 142 | 15 | — | 5 | 20 | 1.67 | 0.17 | 0.82 | A | S | A | EXCELLENT |
| 143 | 15 | — | 5 | 20 | 1.72 | 0.18 | 0.4 | A | S | A | EXCELLENT |
| 144 | 15 | — | 5 | 20 | 1.8 | 0.2 | 1.22 | S | B | B | FAIR |
| 145 | 15 | — | 5 | 20 | 1.81 | 0.23 | 0.67 | A | S | S | EXCELLENT |
| 146 | 15 | — | 5 | 20 | 1.85 | 0.24 | 0.22 | B | S | S | GOOD |
| 147 | 15 | — | — | 20 | 1.82 | 0.29 | 1.47 | A | B | A | GOOD |
| 148 | 15 | — | — | 20 | 1.71 | 0.28 | 0.93 | B | S | S | GOOD |
| 149 | 15 | — | — | 20 | 1.68 | 0.28 | 0.43 | B | S | S | GOOD |
| 150 | 15 | — | — | 20 | 1.43 | 0.4 | 1.03 | S | B | B | FAIR |
| 151 | 15 | — | — | 20 | 1.48 | 0.43 | 1.02 | A | A | B | GOOD |
| 152 | 15 | — | — | 20 | 1.42 | 0.42 | 0.24 | B | S | A | GOOD |
| 153 | 15 | — | — | 20 | 1.44 | 0.44 | 1.55 | A | B | B | FAIR |
| 154 | 15 | — | 5 | 20 | 1.41 | 0.47 | 0.99 | A | A | A | GOOD |
| 155 | 15 | — | 5 | 15 | 1.42 | 0.49 | 0.43 | B | S | S | GOOD |

TABLE 8

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 156 | 99.31 | 0.67 | 0.65 | 0.02 | 32.5 | 66 | 50 | 16 | 89 | 21 | — | 10 | 3 | 5 | — | 15 |
| 157 | 99.65 | 0.33 | 0.3 | 0.03 | 10.0 | 89 | 70 | 19 | 78 | 15 | — | 10 | 3 | 5 | — | 15 |
| 158 | 99.84 | 0.14 | 0.1 | 0.04 | 2.5 | 96 | 70 | 26 | 98 | 30 | — | 10 | 3 | 5 | — | 15 |
| 159 | 99.16 | 0.79 | 0.75 | 0.04 | 18.8 | 402 | 300 | 102 | 98 | 30 | — | 10 | 3 | 5 | — | 15 |
| 160 | 99.70 | 0.24 | 0.2 | 0.04 | 5.0 | 521 | 300 | 221 | 97 | 29 | — | 10 | 3 | 5 | — | 15 |
| 161 | 99.74 | 0.19 | 0.1 | 0.09 | 1.1 | 634 | 400 | 234 | 102 | 29 | — | 10 | 3 | 5 | — | 20 |
| 162 | 99.47 | 0.51 | 0.34 | 0.17 | 2.0 | 111 | 100 | 11 | 102 | 29 | — | 10 | 3 | 5 | — | 20 |
| 163 | 99.63 | 0.34 | 0.23 | 0.11 | 2.1 | 234 | 200 | 34 | 98 | 30 | — | 10 | 3 | 5 | — | 20 |
| 164 | 99.81 | 0.15 | 0.11 | 0.04 | 2.8 | 300 | 200 | 100 | 88 | 20 | — | 10 | 3 | 5 | — | 20 |
| 165 | 99.21 | 0.77 | 0.7 | 0.07 | 10.0 | 98 | 70 | 28 | 88 | 20 | — | 10 | 3 | 5 | — | 20 |
| 166 | 99.65 | 0.33 | 0.3 | 0.03 | 10.0 | 76 | 50 | 26 | 87 | 19 | — | 10 | 3 | 5 | — | 20 |
| 167 | 99.80 | 0.19 | 0.12 | 0.07 | 1.7 | 67 | 40 | 27 | 83 | 10 | — | 10 | 3 | 5 | — | 20 |
| 168 | 99.19 | 0.76 | 0.55 | 0.21 | 2.6 | 428 | 300 | 128 | 83 | 10 | — | 10 | 3 | 5 | — | 20 |
| 169 | 99.49 | 0.45 | 0.23 | 0.22 | 1.0 | 571 | 300 | 271 | 78 | 10 | — | 10 | 3 | 5 | — | 15 |
| 170 | 99.77 | 0.16 | 0.12 | 0.04 | 3.0 | 662 | 500 | 162 | 63 | — | — | 10 | 3 | — | — | 15 |
| 171 | 99.08 | 0.9 | 0.56 | 0.34 | 1.6 | 159 | 100 | 59 | 63 | — | — | 10 | 3 | — | — | 15 |
| 172 | 99.53 | 0.44 | 0.34 | 0.1 | 3.4 | 234 | 100 | 134 | 70 | — | — | 10 | 10 | — | — | 15 |
| 173 | 99.77 | 0.19 | 0.13 | 0.06 | 2.2 | 350 | 200 | 150 | 80 | — | — | 20 | 10 | — | — | 15 |
| 174 | 99.40 | 0.58 | 0.5 | 0.08 | 6.3 | 78 | 50 | 28 | 90 | 10 | — | 20 | 10 | — | — | 15 |
| 175 | 99.59 | 0.39 | 0.32 | 0.07 | 4.6 | 95 | 50 | 45 | 125 | 10 | — | 20 | 10 | — | — | 45 |

| EXAMPLE No. | Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENER-ATION | OVERALL EVALUATION |
|---|---|---|---|---|---|---|---|---|---|---|---|---|
| 156 | 15 | — | 5 | 15 | 1.49 | 0.42 | 1.33 | A | B | A | GOOD |
| 157 | 15 | — | — | 15 | 1.37 | 0.35 | 0.67 | B | S | S | GOOD |
| 158 | 15 | — | 5 | 15 | 1.32 | 0.3 | 0.32 | B | S | S | GOOD |
| 159 | 15 | — | 5 | 15 | 1.03 | 0.32 | 1.52 | A | B | B | FAIR |
| 160 | 15 | — | 5 | 15 | 1.09 | 0.34 | 0.51 | B | S | A | GOOD |
| 161 | 15 | — | 5 | 15 | 1.12 | 0.22 | 0.41 | B | S | A | GOOD |
| 162 | 15 | — | 5 | 15 | 1.18 | 0.25 | 1.02 | A | B | B | FAIR |
| 163 | 15 | — | — | 15 | 1.19 | 0.3 | 0.87 | B | S | S | GOOD |
| 164 | 15 | — | — | 15 | 1.15 | 0.25 | 0.32 | B | S | S | GOOD |
| 165 | 15 | — | — | 15 | 1.14 | 0.28 | 1.55 | B | B | A | FAIR |

TABLE 8-continued

| No. | Zr | W | Sc | OTHERS | 111 | 200 | PERCENTAGE % | LIFE | TOOL | HEAT GENERATION | OVERALL EVALUATION |
|---|---|---|---|---|---|---|---|---|---|---|---|
| 166 | 15 | — | — | 15 | 1.16 | 0.42 | 0.65 | B | S | S | GOOD |
| 167 | 15 | — | 5 | 15 | 1.12 | 0.45 | 0.38 | B | S | S | GOOD |
| 168 | 15 | — | 5 | 15 | 1.6 | 0.59 | 1.52 | S | B | B | FAIR |
| 169 | 15 | — | 5 | 15 | 1.67 | 0.81 | 0.92 | A | S | A | EXCELLENT |
| 170 | 15 | — | 5 | 15 | 1.65 | 0.87 | 0.38 | A | S | A | EXCELLENT |
| 171 | 15 | — | 5 | 15 | 1.71 | 0.87 | 1.7 | S | B | B | FAIR |
| 172 | 15 | — | 5 | 15 | 1.88 | 0.67 | 0.92 | S | A | A | EXCELLENT |
| 173 | 15 | — | 5 | 15 | 1.96 | 0.91 | 0.31 | B | S | S | GOOD |
| 174 | 15 | — | 5 | 15 | 1.9 | 0.95 | 1.22 | A | B | A | GOOD |
| 175 | 15 | — | 10 | 15 | 1.6 | 0.9 | 0.86 | B | S | S | GOOD |

TABLE 9

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | Mg | Cu | Ni | Zn | Cr | Mn | Ti |
|---|---|---|---|---|---|---|---|---|---|---|---|---|---|---|---|---|
| 176 | 99.84 | 0.14 | 0.1 | 0.04 | 2.5 | 64 | 50 | 14 | 130 | 10 | 5 | 20 | 10 | — | — | 45 |
| 177 | 99.42 | 0.52 | 0.5 | 0.02 | 25.0 | 490 | 400 | 90 | 134 | 11 | 5 | 20 | 10 | — | 3 | 45 |
| 178 | 99.63 | 0.3 | 0.23 | 0.07 | 3.3 | 567 | 400 | 167 | 135 | 12 | 5 | 20 | 10 | — | 3 | 45 |
| 179 | 99.78 | 0.11 | 0.1 | 0.01 | 10.0 | 970 | 900 | 70 | 139 | 16 | 5 | 20 | 10 | — | 3 | 45 |
| 180 | 99.22 | 0.75 | 0.74 | 0.01 | 74.0 | 122 | 100 | 22 | 139 | 16 | 5 | 20 | 10 | — | 3 | 45 |
| 181 | 99.65 | 0.31 | 0.3 | 0.01 | 30.0 | 234 | 200 | 34 | 145 | 17 | 5 | 20 | 15 | — | 3 | 45 |
| 182 | 99.76 | 0.19 | 0.1 | 0.09 | 1.1 | 345 | 300 | 45 | 132 | 29 | 5 | 20 | 15 | — | 3 | 20 |
| 183 | 99.18 | 0.8 | 0.75 | 0.05 | 15.0 | 47 | 20 | 21 | 132 | 29 | 5 | 20 | 15 | — | 3 | 20 |
| 184 | 99.66 | 0.32 | 0.23 | 0.09 | 2.6 | 67 | 40 | 27 | 131 | 28 | 5 | 20 | 15 | — | 3 | 20 |
| 185 | 99.85 | 0.13 | 0.1 | 0.03 | 3.3 | 80 | 40 | 40 | 143 | 30 | 5 | 20 | 15 | 10 | 3 | 20 |
| 186 | 99.17 | 0.77 | 0.7 | 0.07 | 10.0 | 404 | 300 | 104 | 151 | 33 | 5 | 20 | 20 | 10 | 3 | 20 |
| 187 | 99.68 | 0.25 | 0.23 | 0.02 | 11.5 | 560 | 500 | 60 | 153 | 35 | 5 | 20 | 20 | 10 | 3 | 20 |
| 188 | 99.73 | 0.18 | 0.15 | 0.03 | 5.0 | 777 | 500 | 277 | 153 | 40 | 5 | 20 | 15 | 10 | 3 | 20 |
| 189 | 99.18 | 0.79 | 0.76 | 0.03 | 25.3 | 134 | 100 | 34 | 153 | 40 | 5 | 20 | 15 | 10 | 3 | 20 |
| 190 | 99.48 | 0.48 | 0.44 | 0.04 | 11.0 | 289 | 200 | 89 | 123 | 20 | 5 | 20 | 10 | 5 | 3 | 20 |
| 191 | 99.76 | 0.19 | 0.13 | 0.06 | 2.2 | 389 | 200 | 189 | 128 | 25 | 5 | 20 | 10 | 5 | 3 | 20 |
| 192 | 98.99 | 0.99 | 0.6 | 0.19 | 4.2 | 40 | 30 | 18 | 128 | 25 | 5 | 20 | 10 | 5 | 3 | 20 |
| 193 | 99.52 | 0.46 | 0.32 | 0.14 | 2.3 | 78 | 30 | 48 | 123 | 25 | 5 | 20 | 5 | 5 | 3 | 20 |
| 194 | 99.80 | 0.18 | 0.17 | 0.01 | 17.0 | 98 | 50 | 48 | 119 | 21 | 5 | 20 | 5 | 5 | 3 | 20 |
| 195 | 99.40 | 0.55 | 0.5 | 0.05 | 10.0 | 421 | 300 | 121 | 119 | 21 | 5 | 20 | 5 | 5 | 3 | 20 |

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENERATION | OVERALL EVALUATION |
|---|---|---|---|---|---|---|---|---|---|---|---|
| 176 | 15 | — | 10 | 15 | 1.55 | 0.55 | 0.32 | B | S | S | GOOD |
| 177 | 15 | — | 10 | 15 | 1.32 | 0.59 | 1.06 | S | B | B | FAIR |
| 178 | 15 | — | 10 | 15 | 1.34 | 0.6 | 0.77 | A | S | A | EXCELLENT |
| 179 | 15 | — | 10 | 15 | 1.44 | 0.77 | 0.32 | B | S | B | FAIR |
| 180 | 15 | — | 10 | 15 | 1.45 | 0.71 | 1.68 | A | B | B | FAIR |
| 181 | 15 | — | 10 | 15 | 1.37 | 0.73 | 0.85 | B | S | S | GOOD |
| 182 | 15 | — | 10 | 15 | 1.33 | 0.72 | 0.41 | B | S | S | GOOD |
| 183 | 15 | — | 10 | 15 | 1.27 | 0.73 | 1.64 | B | B | A | FAIR |
| 184 | 15 | — | 10 | 15 | 1.22 | 0.78 | 0.93 | B | S | S | GOOD |
| 185 | 15 | — | 10 | 15 | 1.3 | 0.86 | 0.3 | B | S | S | GOOD |
| 186 | 15 | — | 10 | 15 | 1.1 | 0.81 | 1.44 | A | B | B | FAIR |
| 187 | 15 | — | 10 | 15 | 1.17 | 0.82 | 0.45 | B | S | A | GOOD |
| 188 | 15 | — | 10 | 15 | 1.12 | 0.88 | 0.38 | B | S | A | GOOD |
| 189 | 15 | — | 10 | 15 | 1.16 | 0.92 | 1.6 | A | B | B | FAIR |
| 190 | 15 | — | 10 | 15 | 1.18 | 0.97 | 0.97 | B | A | A | GOOD |
| 191 | 15 | — | 10 | 15 | 1.15 | 0.91 | 0.41 | B | S | S | GOOD |
| 192 | 15 | — | 10 | 15 | 1.14 | 0.57 | 1.95 | B | B | B | FAIR |
| 193 | 15 | — | 10 | 15 | 1.06 | 0.62 | 0.95 | B | A | S | GOOD |
| 194 | 15 | — | 10 | 15 | 1.08 | 0.66 | 0.44 | B | S | S | GOOD |
| 195 | 15 | — | 10 | 15 | 1.52 | 0.02 | 1.12 | S | B | B | FAIR |

TABLE 10

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 196 | 99.63 | 0.3 | 0.2 | 0.1 | 2.0 | 587 | 300 | 267 | 115 | 17 | 5 | 20 | 5 | 5 | 3 | 20 |
| 197 | 99.81 | 0.11 | 0.1 | 0.01 | 10.0 | 656 | 300 | 356 | 115 | 17 | 5 | 20 | 5 | 5 | 3 | 20 |
| 198 | 99.17 | 0.81 | 0.75 | 0.06 | 12.5 | 134 | 100 | 34 | 115 | 17 | 5 | 20 | 5 | 5 | 3 | 20 |
| 199 | 99.65 | 0.31 | 0.3 | 0.01 | 30.0 | 278 | 200 | 78 | 123 | 20 | 10 | 20 | 5 | 5 | 3 | 20 |
| 200 | 99.78 | 0.17 | 0.12 | 0.05 | 2.4 | 345 | 200 | 145 | 148 | 30 | 10 | 20 | 5 | 5 | 3 | 20 |
| 201 | 99.01 | 0.97 | 0.7 | 0.27 | 2.6 | 47 | 40 | 7 | 153 | 30 | 10 | 20 | 5 | 5 | 3 | 20 |
| 202 | 99.62 | 0.36 | 0.32 | 0.04 | 8.0 | 45 | 30 | 15 | 153 | 30 | 10 | 20 | 5 | 5 | 3 | 20 |
| 203 | 99.84 | 0.14 | 0.1 | 0.04 | 2.5 | 67 | 30 | 37 | 148 | 30 | 10 | 20 | 5 | 5 | 3 | 20 |
| 204 | 99.23 | 0.71 | 0.6 | 0.11 | 5.5 | 456 | 400 | 56 | 146 | 23 | 10 | 20 | 5 | 10 | 3 | 20 |
| 205 | 99.69 | 0.25 | 0.2 | 0.05 | 4.0 | 477 | 400 | 77 | 165 | 27 | 10 | 20 | 5 | 10 | 3 | 20 |
| 206 | 99.73 | 0.2 | 0.14 | 0.06 | 2.3 | 489 | 400 | 89 | 165 | 27 | 10 | 20 | 5 | 10 | 3 | 20 |
| 207 | 99.40 | 0.55 | 0.5 | 0.05 | 10.0 | 356 | 300 | 56 | 152 | 27 | 10 | 20 | 5 | 10 | 5 | 20 |
| 208 | 99.65 | 0.3 | 0.28 | 0.02 | 14.0 | 321 | 300 | 21 | 159 | 19 | 20 | 20 | 5 | 10 | 5 | 20 |
| 209 | 99.83 | 0.12 | 0.1 | 0.02 | 5.0 | 302 | 200 | 102 | 152 | 17 | 20 | 20 | 5 | 10 | 5 | 20 |
| 210 | 99.39 | 0.59 | 0.56 | 0.03 | 18.7 | 76 | 40 | 36 | 156 | 21 | 20 | 20 | 5 | 10 | 5 | 20 |
| 211 | 99.59 | 0.39 | 0.34 | 0.05 | 6.8 | 87 | 50 | 37 | 156 | 21 | 20 | 20 | 5 | 10 | 5 | 20 |
| 212 | 99.79 | 0.18 | 0.12 | 0.06 | 2.0 | 95 | 50 | 45 | 180 | 40 | 20 | 20 | 5 | 10 | 5 | 20 |
| 213 | 99.42 | 0.51 | 0.45 | 0.06 | 7.5 | 506 | 400 | 106 | 180 | 40 | 20 | 20 | 5 | 10 | 5 | 20 |
| 214 | 99.70 | 0.22 | 0.2 | 0.02 | 10.0 | 654 | 400 | 254 | 175 | 35 | 20 | 20 | 5 | 10 | 5 | 20 |
| 215 | 99.76 | 0.15 | 0.1 | 0.05 | 2.0 | 721 | 400 | 321 | 180 | 35 | 20 | 20 | 5 | 10 | 5 | 20 |

| EXAMPLE No. | DETAILS Zr | W | Sc | OTHERS | ORIENTATION INDEX 111 | 200 | AREA RATIO OF PRECIPITATED PARTICLES PERCENTAGE % | WIRE EVALUATION LIFE | TOOL | HEAT GENERATION | OVERALL EVALUATION |
|---|---|---|---|---|---|---|---|---|---|---|---|
| 196 | 15 | — | 10 | 15 | 1.57 | 0.02 | 0.67 | A | S | A | EXCELLENT |
| 197 | 15 | — | 10 | 15 | 1.59 | 0.03 | 0.23 | A | S | A | EXCELLENT |
| 198 | 15 | — | 10 | 15 | 1.65 | 0.04 | 1.78 | S | B | B | FAIR |
| 199 | 15 | — | 10 | 15 | 1.76 | 0.04 | 0.62 | A | S | S | EXCELLENT |
| 200 | 15 | 15 | 10 | 15 | 1.77 | 0.05 | 0.33 | B | S | S | GOOD |
| 201 | 15 | 20 | 10 | 15 | 1.76 | 0.04 | 1.95 | A | B | B | FAIR |
| 202 | 15 | 20 | 10 | 15 | 1.85 | 0.01 | 0.72 | B | S | S | GOOD |
| 203 | 15 | 15 | 10 | 15 | 1.82 | 0.01 | 0.34 | B | S | S | GOOD |
| 204 | 15 | 15 | 10 | 15 | 1.42 | 0.02 | 1.44 | S | B | B | FAIR |
| 205 | 15 | 30 | 10 | 15 | 1.41 | 0.05 | 0.67 | A | S | A | EXCELLENT |
| 206 | 15 | 30 | 10 | 15 | 1.4 | 0.07 | 0.63 | B | S | A | GOOD |
| 207 | 15 | 15 | 10 | 15 | 1.38 | 0.07 | 1.12 | A | B | B | FAIR |
| 208 | 15 | 20 | 10 | 15 | 1.28 | 0.08 | 0.72 | B | S | S | GOOD |
| 209 | 15 | 15 | 10 | 15 | 1.32 | 0.07 | 0.16 | B | S | S | GOOD |
| 210 | 15 | 15 | 10 | 15 | 1.33 | 0.05 | 1.23 | A | B | A | GOOD |
| 211 | 15 | 15 | 10 | 15 | 1.42 | 0.04 | 0.82 | B | S | S | GOOD |
| 212 | 15 | 20 | 10 | 15 | 1.47 | 0.04 | 0.27 | B | S | S | GOOD |
| 213 | 15 | 20 | 10 | 15 | 1.1 | 0.03 | 1.04 | A | B | B | FAIR |
| 214 | 15 | 20 | 10 | 15 | 1.16 | 0.03 | 0.38 | B | S | A | GOOD |
| 215 | 10 | 20 | 20 | 15 | 1.17 | 0.02 | 0.42 | B | S | A | GOOD |

TABLE 11

| EXAMPLE No. | Al (MASS %) | Fe + Si (MASS %) | DETAILS Fe | Si | Fe/Si MASS RATIO | Ga + V (MASS ppm) | DETAILS Ga | V | TRACE ELEMENTS (MASS ppm) | DETAILS Mg | Cu | Ni | Zn | Cr | Mn | Ti |
|---|---|---|---|---|---|---|---|---|---|---|---|---|---|---|---|---|
| 216 | 99.10 | 0.87 | 0.78 | 0.09 | 8.7 | 135 | 100 | 35 | 170 | 35 | 10 | 20 | 5 | 10 | 5 | 20 |
| 217 | 99.50 | 0.47 | 0.45 | 0.02 | 22.5 | 146 | 100 | 46 | 181 | 36 | 10 | 20 | 5 | 10 | 10 | 20 |
| 218 | 99.77 | 0.19 | 0.17 | 0.02 | 8.5 | 167 | 100 | 67 | 187 | 37 | 10 | 20 | 10 | 10 | 10 | 20 |
| 219 | 99.32 | 0.65 | 0.64 | 0.01 | 64.0 | 87 | 70 | 17 | 194 | 37 | 12 | 20 | 10 | 10 | 10 | 20 |
| 220 | 99.67 | 0.3 | 0.23 | 0.07 | 3.3 | 95 | 80 | 15 | 197 | 40 | 12 | 20 | 10 | 10 | 10 | 20 |
| 221 | 99.83 | 0.15 | 0.1 | 0.05 | 2.0 | 75 | 50 | 25 | 167 | 25 | 12 | 20 | 10 | 10 | 10 | 20 |
| 222 | 99.04 | 0.88 | 0.8 | 0.08 | 10.0 | 590 | 400 | 190 | 174 | 25 | 19 | 20 | 10 | 10 | 10 | 20 |
| 223 | 99.61 | 0.32 | 0.23 | 0.09 | 2.6 | 521 | 400 | 121 | 177 | 25 | 17 | 20 | 10 | 10 | 10 | 20 |
| 224 | 99.75 | 0.18 | 0.12 | 0.06 | 2.0 | 555 | 400 | 155 | 165 | 20 | 10 | 20 | 10 | 10 | 10 | 20 |
| 225 | 99.20 | 0.75 | 0.7 | 0.05 | 14.0 | 300 | 200 | 100 | 160 | 20 | 5 | 20 | 10 | 10 | 10 | 20 |
| 226 | 99.57 | 0.38 | 0.23 | 0.15 | 1.6 | 310 | 200 | 110 | 163 | 20 | 3 | 20 | 10 | 10 | 10 | 20 |
| 227 | 99.81 | 0.14 | 0.11 | 0.03 | 3.7 | 324 | 200 | 124 | 163 | 20 | 3 | 20 | 10 | 10 | 10 | 20 |

TABLE 11-continued

| No. | Al | Fe+Si | Fe | Si | Fe/Si | Ga+V | Ga | V | Trace | Mg | Cu | Ni | Zn | Cr | Mn | Ti |
|---|---|---|---|---|---|---|---|---|---|---|---|---|---|---|---|---|
| 228 | 99.47 | 0.51 | 0.43 | 0.08 | 5.4 | 87 | 50 | 37 | 163 | 20 | 3 | 20 | 10 | 10 | 10 | 20 |
| 229 | 99.52 | 0.45 | 0.44 | 0.01 | 44.0 | 95 | 50 | 45 | 168 | 20 | 3 | 20 | 10 | 10 | 10 | 20 |
| 230 | 99.79 | 0.19 | 0.14 | 0.05 | 2.8 | 59 | 40 | 19 | 167 | 20 | 2 | 20 | 10 | 10 | 10 | 20 |
| 231 | 99.35 | 0.58 | 0.43 | 0.15 | 2.9 | 578 | 300 | 278 | 147 | 15 | 2 | 20 | 10 | 10 | 10 | 20 |
| 232 | 99.63 | 0.31 | 0.25 | 0.06 | 4.2 | 501 | 300 | 201 | 147 | 15 | 2 | 20 | 10 | 10 | 10 | 20 |
| 233 | 99.79 | 0.15 | 0.1 | 0.05 | 2.0 | 480 | 300 | 180 | 153 | 16 | 2 | 20 | 10 | 10 | 10 | 20 |
| 234 | 99.17 | 0.8 | 0.75 | 0.05 | 15.0 | 111 | 100 | 11 | 168 | 17 | 21 | 20 | 10 | 10 | 10 | 20 |
| 235 | 99.51 | 0.46 | 0.43 | 0.03 | 14.3 | 178 | 100 | 78 | 147 | 17 | — | 20 | 10 | 10 | 10 | 20 |

| EXAMPLE | DETAILS | | | | ORIENTATION INDEX | | AREA RATIO OF PRECIPITATED PARTICLES | WIRE EVALUATION | | | |
|---|---|---|---|---|---|---|---|---|---|---|---|
| No. | Zr | W | Sc | OTHERS | 111 | 200 | PERCENTAGE % | LIFE | TOOL | HEAT GENER-ATION | OVERALL EVALUATION |
| 216 | 10 | 20 | 20 | 15 | 1.12 | 0.01 | 1.83 | A | B | B | FAIR |
| 217 | 10 | 25 | 20 | 15 | 1.16 | 0.01 | 0.99 | B | A | A | GOOD |
| 218 | 10 | 25 | 20 | 15 | 1.19 | 0.04 | 0.55 | B | S | S | GOOD |
| 219 | 10 | 30 | 20 | 15 | 1.15 | 0.03 | 1.27 | B | B | A | FAIR |
| 220 | 10 | 30 | 20 | 15 | 1.12 | 0.03 | 0.67 | B | S | S | GOOD |
| 221 | 10 | 15 | 20 | 15 | 1.19 | 0.05 | 0.35 | B | S | S | GOOD |
| 222 | 10 | 15 | 20 | 15 | 1.53 | 0.23 | 1.77 | S | B | B | FAIR |
| 223 | 10 | 20 | 20 | 15 | 1.58 | 0.3 | 0.65 | A | S | A | EXCELLENT |
| 224 | 10 | 20 | 20 | 15 | 1.61 | 0.32 | 0.35 | A | S | A | EXCELLENT |
| 225 | 10 | 20 | 20 | 15 | 1.65 | 0.33 | 1.55 | S | B | B | FAIR |
| 226 | 10 | 25 | 20 | 15 | 1.62 | 0.4 | 0.73 | A | S | S | EXCELLENT |
| 227 | 10 | 25 | 20 | 15 | 1.72 | 0.49 | 0.32 | B | S | S | GOOD |
| 228 | 10 | 25 | 20 | 15 | 1.76 | 0.42 | 1.01 | A | B | A | GOOD |
| 229 | 10 | 30 | 20 | 15 | 1.78 | 0.41 | 0.95 | A | A | S | EXCELLENT |
| 230 | 10 | 30 | 20 | 15 | 1.82 | 0.46 | 0.47 | B | S | S | GOOD |
| 231 | 10 | 15 | 20 | 15 | 1.23 | 0.33 | 1.23 | S | B | B | FAIR |
| 232 | 10 | 15 | 20 | 15 | 1.29 | 0.31 | 0.51 | A | S | A | EXCELLENT |
| 233 | 10 | 20 | 20 | 15 | 1.28 | 0.35 | 0.4 | B | S | A | GOOD |
| 234 | 10 | 15 | 20 | 15 | 1.26 | 0.14 | 1.55 | A | B | B | FAIR |
| 235 | 10 | 15 | 20 | 15 | 1.25 | 0.15 | 0.72 | A | A | A | GOOD |

TABLE 12

| EXAMPLE | Al (MASS | Fe + Si (MASS | DETAILS | | Fe/Si MASS | Ga + V (MASS | DETAILS | | TRACE ELEMENTS (MASS | DETAILS | | | | | | |
|---|---|---|---|---|---|---|---|---|---|---|---|---|---|---|---|---|
| No. | %) | %) | Fe | Si | RATIO | ppm) | Ga | V | ppm) | Mg | Cu | Ni | Zn | Cr | Mn | Ti |
| 236 | 99.78 | 0.18 | 0.15 | 0.03 | 5.0 | 200 | 100 | 100 | 183 | 18 | 20 | 20 | 10 | 10 | 10 | 20 |
| 237 | 99.98 | 0.99 | 0.77 | 0.22 | 3.5 | 87 | 30 | 57 | 171 | 26 | — | 20 | 10 | 10 | 10 | 20 |
| 238 | 99.76 | 0.22 | 0.15 | 0.07 | 2.1 | 67 | 40 | 27 | 181 | 26 | 10 | 20 | 10 | 10 | 10 | 20 |
| 239 | 99.87 | 0.11 | 0.1 | 0.01 | 10.0 | 44 | 40 | 4 | 158 | 13 | 10 | 20 | 10 | 10 | 10 | 20 |
| 240 | 99.24 | 0.7 | 0.65 | 0.05 | 13.0 | 451 | 400 | 51 | 163 | 13 | 10 | 20 | 15 | 10 | 10 | 20 |
| 241 | 99.46 | 0.46 | 0.4 | 0.06 | 6.7 | 598 | 400 | 198 | 163 | 13 | 10 | 20 | 15 | 10 | 10 | 20 |
| 242 | 99.77 | 0.14 | 0.1 | 0.04 | 2.5 | 700 | 400 | 300 | 160 | 20 | 5 | 20 | 15 | 10 | 10 | 20 |
| 243 | 99.15 | 0.81 | 0.77 | 0.04 | 19.3 | 198 | 100 | 98 | 160 | 20 | 5 | 20 | 15 | 10 | 10 | 20 |
| 244 | 99.51 | 0.45 | 0.4 | 0.05 | 8.0 | 267 | 100 | 167 | 155 | 20 | 5 | 20 | 15 | 10 | 10 | 20 |
| 245 | 99.77 | 0.18 | 0.17 | 0.01 | 17.0 | 350 | 200 | 150 | 163 | 23 | 5 | 20 | 15 | 10 | 10 | 20 |
| 246 | 99.11 | 0.87 | 0.83 | 0.04 | 20.8 | 51 | 30 | 21 | 162 | 27 | 5 | 20 | 15 | 10 | 10 | 20 |
| 247 | 99.76 | 0.22 | 0.2 | 0.02 | 10.0 | 66 | 30 | 36 | 162 | 27 | 5 | 20 | 15 | 10 | 10 | 20 |
| 248 | 99.81 | 0.17 | 0.1 | 0.07 | 1.4 | 78 | 30 | 48 | 165 | 30 | 5 | 20 | 15 | 10 | 10 | 20 |
| 249 | 99.42 | 0.52 | 0.5 | 0.02 | 25.0 | 402 | 300 | 102 | 165 | 30 | 5 | 20 | 15 | 10 | 10 | 20 |
| 250 | 99.59 | 0.33 | 0.32 | 0.01 | 32.0 | 598 | 300 | 298 | 162 | 27 | 5 | 20 | 15 | 10 | 10 | 20 |
| 251 | 99.76 | 0.15 | 0.1 | 0.05 | 2.0 | 752 | 400 | 352 | 150 | 15 | 5 | 20 | 15 | 10 | 10 | 20 |
| 252 | 99.31 | 0.66 | 0.4 | 0.26 | 1.5 | 123 | 100 | 23 | 165 | 15 | 5 | 20 | 15 | 10 | 10 | 20 |
| 253 | 99.73 | 0.24 | 0.2 | 0.04 | 5.0 | 149 | 100 | 49 | 160 | 15 | — | 20 | 15 | 10 | 10 | 20 |
| 254 | 99.82 | 0.14 | 0.13 | 0.01 | 13.0 | 267 | 100 | 167 | 160 | 15 | — | 20 | 15 | 10 | 10 | 20 |
| 255 | 99.43 | 0.55 | 0.54 | 0.01 | 54.0 | 48 | 30 | 18 | 165 | 20 | — | 20 | 15 | 10 | 10 | 20 |

TABLE 12-continued

| EXAMPLE | DETAILS | | | | ORIENTATION INDEX | | AREA RATIO OF PRECIPITATED PARTICLES | WIRE EVALUATION | | | |
|---|---|---|---|---|---|---|---|---|---|---|---|
| No. | Zr | W | Sc | OTHERS | 111 | 200 | PERCENTAGE % | LIFE | TOOL | HEAT GENER-ATION | OVERALL EVALUATION |
| 236 | 10 | 30 | 20 | 15 | 1.24 | 0.12 | 0.43 | B | S | S | GOOD |
| 237 | 10 | 30 | 20 | 15 | 1.23 | 0.23 | 1.99 | A | B | B | FAIR |
| 238 | 10 | 30 | 20 | 15 | 1.32 | 0.35 | 0.43 | B | S | S | GOOD |
| 239 | 10 | 20 | 20 | 15 | 1.33 | 0.36 | 0.24 | B | S | S | GOOD |
| 240 | 10 | 20 | 20 | 15 | 1.1 | 0.39 | 1.32 | A | B | B | FAIR |
| 241 | 10 | 20 | 20 | 15 | 1.12 | 0.4 | 0.93 | A | A | B | GOOD |
| 242 | 10 | 15 | 20 | 15 | 1.12 | 0.41 | 0.28 | B | S | A | GOOD |
| 243 | 10 | 15 | 20 | 15 | 1.13 | 0.43 | 1.63 | A | B | B | FAIR |
| 244 | 10 | 15 | 15 | 15 | 1.19 | 0.45 | 0.91 | B | A | A | GOOD |
| 245 | 10 | 20 | 15 | 15 | 1.16 | 0.41 | 0.42 | B | S | S | GOOD |
| 246 | 10 | 20 | 15 | 10 | 1.12 | 0.45 | 1.78 | B | B | B | FAIR |
| 247 | 10 | 20 | 15 | 10 | 1.12 | 0.48 | 0.5 | B | S | S | GOOD |
| 248 | 10 | 20 | 15 | 10 | 1.11 | 0.47 | 0.33 | B | S | S | GOOD |
| 249 | 10 | 20 | 15 | 10 | 1.52 | 0.52 | 1.03 | S | B | B | FAIR |
| 250 | 15 | 15 | 15 | 10 | 1.62 | 0.55 | 0.75 | A | S | A | EXCELLENT |
| 251 | 15 | 15 | 15 | 10 | 1.72 | 0.66 | 0.18 | A | S | A | EXCELLENT |
| 252 | 15 | 30 | 15 | 10 | 1.77 | 0.68 | 1.32 | S | B | B | FAIR |
| 253 | 15 | 30 | 15 | 10 | 1.75 | 0.69 | 0.28 | A | S | S | EXCELLENT |
| 254 | 15 | 30 | 15 | 10 | 1.98 | 0.99 | 0.29 | B | S | S | GOOD |
| 255 | 15 | 30 | 15 | 10 | 1.75 | 0.91 | 1.22 | B | B | A | FAIR |

TABLE 13

| EXAMPLE | Al (MASS | Fe + Si (MASS | DETAILS | | Fe/Si MASS | Ga + V (MASS | DETAILS | | TRACE ELEMENTS (MASS | DETAILS | | | | | | |
|---|---|---|---|---|---|---|---|---|---|---|---|---|---|---|---|---|
| No. | %) | %) | Fe | Si | RATIO | ppm) | Ga | V | ppm) | Mg | Cu | Ni | Zn | Cr | Mn | Ti |
| 256 | 99.66 | 0.32 | 0.3 | 0.02 | 15.0 | 89 | 40 | 49 | 150 | 20 | — | 20 | 15 | 10 | 10 | 20 |
| 257 | 99.93 | 0.05 | 0.03 | 0.02 | 1.5 | 67 | 50 | 17 | 150 | 20 | — | 20 | 15 | 10 | 10 | 20 |
| 258 | 99.05 | 0.89 | 0.78 | 0.11 | 7.1 | 421 | 400 | 21 | 140 | 10 | — | 20 | 15 | 10 | 10 | 20 |
| 259 | 99.55 | 0.38 | 0.3 | 0.08 | 3.8 | 562 | 400 | 162 | 145 | 10 | — | 20 | 15 | 10 | 10 | 20 |
| 260 | 99.80 | 0.12 | 0.1 | 0.02 | 5.0 | 671 | 400 | 271 | 145 | 10 | — | 20 | 15 | 10 | 10 | 20 |
| 261 | 99.01 | 0.95 | 0.7 | 0.25 | 2.8 | 298 | 200 | 98 | 140 | 5 | — | 20 | 15 | 10 | 10 | 20 |
| 262 | 99.48 | 0.48 | 0.32 | 0.16 | 2.0 | 211 | 100 | 111 | 140 | 5 | — | 20 | 15 | 10 | 10 | 20 |
| 263 | 99.81 | 0.14 | 0.1 | 0.04 | 2.5 | 319 | 150 | 169 | 140 | 5 | — | 20 | 15 | 10 | 10 | 20 |
| 264 | 99.20 | 0.76 | 0.76 | 0.02 | 38.0 | 66 | 40 | 26 | 145 | 5 | — | 20 | 15 | 10 | 10 | 30 |
| 265 | 99.61 | 0.37 | 0.32 | 0.05 | 6.4 | 78 | 40 | 38 | 145 | 5 | — | 20 | 15 | 10 | 10 | 30 |
| 266 | 99.79 | 0.19 | 0.13 | 0.06 | 2.2 | 90 | 50 | 40 | 140 | — | — | 20 | 15 | 10 | 10 | 30 |
| 267 | 99.03 | 0.89 | 0.76 | 0.13 | 5.8 | 689 | 500 | 189 | 140 | — | — | 20 | 15 | 10 | 10 | 30 |
| 268 | 99.47 | 0.45 | 0.32 | 0.13 | 2.5 | 651 | 500 | 151 | 150 | — | 10 | 20 | 15 | 10 | 10 | 30 |
| 269 | 99.73 | 0.18 | 0.13 | 0.05 | 2.6 | 710 | 500 | 210 | 150 | — | 10 | 20 | 15 | 10 | 10 | 30 |
| 270 | 99.36 | 0.61 | 0.43 | 0.18 | 2.4 | 120 | 80 | 40 | 150 | 30 | 10 | 20 | 15 | 10 | 10 | 30 |
| 271 | 99.66 | 0.31 | 0.2 | 0.11 | 1.8 | 198 | 100 | 98 | 150 | 30 | 10 | 20 | 15 | 10 | 10 | 30 |
| 272 | 99.80 | 0.17 | 0.13 | 0.04 | 3.3 | 155 | 100 | 55 | 144 | 32 | 2 | 20 | 15 | 10 | 10 | 30 |
| 273 | 99.02 | 0.96 | 0.94 | 0.02 | 47.0 | 67 | 40 | 27 | 145 | 33 | 2 | 20 | 15 | 10 | 10 | 30 |
| 274 | 99.73 | 0.25 | 0.2 | 0.05 | 4.0 | 60 | 50 | 10 | 152 | 40 | 2 | 20 | 15 | 10 | 10 | 30 |
| 275 | 99.82 | 0.16 | 0.12 | 0.04 | 3.0 | 58 | 40 | 18 | 152 | 40 | 2 | 20 | 15 | 10 | 10 | 30 |

| EXAMPLE | DETAILS | | | | ORIENTATION INDEX | | AREA RATIO OF PRECIPITATED PARTICLES | WIRE EVALUATION | | | |
|---|---|---|---|---|---|---|---|---|---|---|---|
| No. | Zr | W | Sc | OTHERS | 111 | 200 | PERCENTAGE % | LIFE | TOOL | HEAT GENER-ATION | OVERALL EVALUATION |
| 256 | 15 | 15 | 15 | 10 | 1.65 | 0.92 | 0.52 | B | S | S | GOOD |
| 257 | 15 | 15 | 15 | 10 | 1.78 | 0.78 | 0.07 | B | S | S | GOOD |
| 258 | 15 | 15 | 15 | 10 | 1.34 | 0.88 | 1.8 | S | B | B | FAIR |
| 259 | 15 | 20 | 15 | 10 | 1.32 | 0.86 | 0.59 | A | S | A | EXCELLENT |
| 260 | 15 | 20 | 15 | 10 | 1.32 | 0.78 | 0.32 | B | S | A | GOOD |
| 261 | 15 | 20 | 15 | 10 | 1.29 | 0.68 | 1.9 | S | B | B | FAIR |
| 262 | 15 | 20 | 15 | 10 | 1.27 | 0.52 | 0.8 | A | A | A | GOOD |
| 263 | 15 | 20 | 15 | 10 | 1.26 | 0.55 | 0.33 | B | S | S | GOOD |
| 264 | 15 | 15 | 15 | 10 | 1.24 | 0.57 | 1.67 | A | B | A | GOOD |
| 265 | 15 | 15 | 15 | 10 | 1.44 | 0.64 | 0.76 | B | S | S | GOOD |

TABLE 13-continued

| 266 | 15 | 15 | 15 | 10 | 1.42 | 0.68 | 0.32 | B | S | S | GOOD |
|---|---|---|---|---|---|---|---|---|---|---|---|
| 267 | — | 30 | 15 | 10 | 1.1 | 0.7 | 1.77 | A | B | B | FAIR |
| 268 | — | 30 | 15 | 10 | 1.12 | 0.71 | 0.86 | A | A | B | GOOD |
| 269 | — | 30 | 15 | 10 | 1.11 | 0.77 | 0.38 | B | S | A | GOOD |
| 270 | — | — | 15 | 10 | 1.1 | 0.8 | 1.23 | A | B | B | FAIR |
| 271 | — | — | 15 | 10 | 1.12 | 0.82 | 0.47 | B | S | S | GOOD |
| 272 | — | — | 15 | 10 | 1.18 | 0.85 | 0.45 | B | S | S | GOOD |
| 273 | — | — | 15 | 10 | 1.19 | 0.88 | 1.93 | B | B | B | FAIR |
| 274 | — | — | 15 | 10 | 1.14 | 0.81 | 0.53 | B | S | S | GOOD |
| 275 | — | — | 15 | 10 | 1.18 | 0.87 | 0.6 | B | S | S | GOOD |

It should be noted that details of the elements contained in the aluminum wires of the examples shown in Table 1 are shown in Table 14.

Regarding the area ratio of the precipitated particles, an image taken at a magnification of 400 times in the same manner as in the examples was binarized into precipitated

TABLE 14

| EXAMPLE | EESSENTIAL ELEMENTS (MASS %) | | | OPTIONAL ELEMENTS (MASS ppm) | | | TRACE ELEMENTS (MASS ppm) | | | | | | | | | | | | |
|---|---|---|---|---|---|---|---|---|---|---|---|---|---|---|---|---|---|---|---|
| No. | Al | Fe + Si | Fe | Si | Ga + V | Ga | V | Mg | Cu | Ni | Zn | Cr | Mn | Ti | Zr | W | Sc | OTHERS | TOTAL |
| 1 | 99.09 | 0.9 | 0.8 | 0.1 | 52 | 37 | 15 | 10 | — | 10 | — | — | 5 | 10 | — | — | | 13 | 48 |
| 9 | 99.80 | 0.11 | 0.1 | 0.01 | 785 | 385 | 400 | 15 | 5 | 15 | 5 | 5 | 5 | 10 | 5 | 15 | 15 | 20 | 115 |
| 17 | 99.44 | 0.55 | 0.5 | 0.05 | 46 | 32 | 14 | 10 | 10 | 10 | — | — | — | 5 | 5 | — | 5 | 9 | 54 |
| 25 | 99.28 | 0.63 | 0.6 | 0.03 | 820 | 500 | 320 | 10 | — | 12 | 5 | 5 | 5 | 10 | 5 | — | 10 | 18 | 80 |

Next, comparative examples will be described. An aluminum metal having a purity of 99.9 mass % or more was prepared in the same manner as in the examples, and Fe, Si, Ga, and V were added so as to have the compositions shown in Table 15. Comparative Examples 1 to 4 are wires having the same composition as Example 17 but are wires prepared by changing the manufacturing conditions such as heat treatment temperature or time at the intermediate wire diameter and the final wire diameter, a processing rate from each wire diameter to the next wire diameter, a cooling speed after the intermediate heat treatment, and an area reduction rate of each die. Further, Comparative Examples 5 particles (a high brightness value in white) and other than the precipitated particles (a low brightness value in black) based on a brightness value threshold of 0.95, to obtain the area ratio of the precipitated particles. FIG. 2 shows precipitated particles of the aluminum wire of Comparative Example 6, and the area ratio was 3.2% as shown in Table 15. Although the area ratio is obtained from a photograph taken at a magnification of 400 times, FIG. 2 is a photograph after binarization processing which was taken at a magnification of 1000 times so that the precipitated particles can be easily distinguished.

TABLE 15

| | | WIRE COMPOSITIONS | | | | WIRE PROPERTIES | | | | | |
|---|---|---|---|---|---|---|---|---|---|---|---|
| | | | | | | | AREA RATIO OF | WIRE EVALUATION | | | |
| | | Al MASS | Fe + Si MASS | Ga + V MASS | OTHERS MASS | ORIENTATION INDEX | | PRECIPITATED PARTICLES | LIFE | TOOL DETACH- | HEAT GENER- | OVERALL EVALU- |
| | No. | % | % | ppm | ppm | (111) | (200) | PERCENTAGE % | TEST | MENT | ATION | ATION |
| COMPAR- | 1 | 99.44 | 0.55 | 46 | 54 | 1.9 | 0.4 | 2.2 | A | C | A | POOR |
| ATIVE | 2 | 99.44 | 0.55 | 46 | 54 | 0.8 | 1.3 | 1.8 | C | A | A | POOR |
| EXAMPLES | 3 | 99.44 | 0.55 | 46 | 54 | 0.5 | 1.2 | 1.7 | C | A | A | POOR |
| | 4 | 99.44 | 0.55 | 46 | 54 | 1.8 | 0.4 | 2.3 | A | C | A | POOR |
| | 5 | 99.94 | 0.03 | 280 | 20 | 1.5 | 0.6 | 0.06 | C | A | A | POOR |
| | 6 | 98.89 | 1.1 | 60 | 40 | 1.3 | 0.8 | 3.2 | S | C | C | POOR | and 6 differ from the examples in the composition itself. The measurement methods of the orientation indexes, the area ratios of the precipitated particles, and the residual resistance ratios (heat generation) of the aluminum wires of these comparative examples were also performed in the same manner as in Example 1, and the measurement results were summarized in Table 15.

Further, the aluminum wire of Comparative Example 1 was examined for wire detachment from a wedge tool. Separately, a wire similar to the aluminum wire of Comparative Example 1 was prepared, bent to the side at 30° horizontally with respect to the longitudinal direction of the wire after the first bonding, and subjected to the second bonding; as a result, as in the lower left photograph of FIG. 4 described above, wire detachment from the wedge tool occurred, and the wire was bonded in a state of making a one-sided contact. The bonding conditions were set such that the ultrasonic energy and the pressure were optimal for each sample. The upper left of FIG. 4 shows the wire after the first bonding by means of ultrasonic waves, and as described above, the wire on the left side of the upper left photograph was obliquely cut, and the wire on the right side could not be bonded to the substrate and caused a bonding failure.

Further, in the same manner as in the examples, Table 15 shows the results of the life measurement of the power cycle test, the tool detachment test, the heat generation evaluation test, and the overall evaluation for Comparative Examples 1 to 6.

Next, details of the other elements contained in the aluminum wires of the comparative examples shown in Table 15 are shown together in Table 16.

TABLE 16

| COMPARATIVE EXAMPLE No. | EESSENTIAL ELEMENTS (MASS %) | | | | OPTIONAL ELEMENTS (MASS ppm) | | | TRACE ELEMENTS (MASS ppm) | | | | | | | | | | | |
|---|---|---|---|---|---|---|---|---|---|---|---|---|---|---|---|---|---|---|---|
| | Al | Fe + Si | Fe | Si | Ga + V | Ga | V | Mg | Cu | Ni | Zn | Cr | Mn | Ti | Zr | W | Sc | OTHERS | TOTAL |
| 1 | 99.44 | 0.55 | 0.5 | 0.05 | 46 | 32 | 14 | 8 | — | 8 | — | — | — | 5 | 5 | 15 | 5 | 8 | 54 |
| 5 | 99.94 | 0.03 | 0.02 | 0.01 | 280 | 200 | 80 | 5 | — | 5 | — | — | 5 | — | — | — | — | 5 | 20 |
| 6 | 98.89 | 1.1 | 0.8 | 0.3 | 60 | 40 | 20 | 10 | 5 | 5 | 5 | 5 | — | 5 | — | — | — | 5 | 40 |

Further, aluminum wires of Comparative Example 7 and the subsequent comparative examples were obtained in the same manner as in Example 33 described above, except that an aluminum metal having a purity of 99.9 mass % or more was prepared, elements other than aluminum (Fe, Si, Ga, and V) were added so as to have the compositions shown in Tables 17 and 18, and the manufacturing conditions such as heat treatment conditions were changed. For these aluminum wires of Comparative Example 7 and the subsequent comparative examples, each of the properties was evaluated in the same manner as in the examples. The results are shown in Tables 17 and 18. It should be noted that the comparative examples shown in Tables 17 and 18 used the criteria of "Tool Detachment Evaluation 2", "Measurement 2 of Residual Resistance Ratio", and "Overall Evaluation 2" for the tool detachment, the residual resistance ratio, and the overall evaluation, respectively.

TABLE 17

| COMPARATIVE EXAMPLE No. | Al (MASS %) | Fe + Si (MASS %) | DETAILS | | Fe/Si MASS RATIO | Ga + V (MASS ppm) | DETAILS | | TRACE ELEMENTS (MASS ppm) | DETAILS | | | | | | |
|---|---|---|---|---|---|---|---|---|---|---|---|---|---|---|---|---|
| | | | Fe | Si | | | Ga | V | | Mg | Cu | Ni | Zn | Cr | Mn | Ti |
| 7 | 98.76 | 1.2 | 1 | 0.2 | 5.0 | 243 | 100 | 143 | 130 | 30 | — | 20 | 10 | — | 5 | 30 |
| 8 | 98.89 | 1.1 | 1 | 0.1 | 10.0 | 19 | 10 | 9 | 125 | 30 | — | 10 | 10 | 5 | 5 | 30 |
| 9 | 99.90 | 0.008 | 0.007 | 0.001 | 7.0 | 820 | 600 | 220 | 120 | 25 | — | 10 | 10 | 5 | 5 | 30 |
| 10 | 98.68 | 1.22 | 1 | 0.22 | 4.5 | 888 | 600 | 288 | 115 | 25 | — | 10 | 10 | 5 | 5 | 30 |
| 11 | 99.51 | 0.48 | 0.34 | 0.12 | 2.8 | 178 | 100 | 78 | 115 | 25 | — | 15 | 10 | — | 5 | 30 |
| 12 | 99.91 | 0.06 | 0.03 | 0.03 | 1.0 | 201 | 100 | 101 | 115 | 30 | — | 15 | 10 | — | — | 30 |
| 13 | 98.81 | 1.15 | 1.1 | 0.05 | 22.0 | 305 | 200 | 105 | 132 | 32 | 10 | 15 | 10 | 5 | — | 30 |
| 14 | 99.73 | 0.26 | 0.23 | 0.03 | 7.7 | — | — | — | 132 | 32 | 10 | 15 | 10 | 5 | — | 30 |
| 15 | 98.67 | 1.31 | 1.1 | 0.21 | 5.2 | 40 | 20 | 20 | 122 | 22 | 10 | 15 | 10 | 5 | — | 30 |
| 16 | 99.45 | 0.44 | 0.3 | 0.14 | 2.1 | 960 | 600 | 360 | 117 | 17 | 10 | 15 | 10 | 5 | — | 30 |
| 17 | 98.72 | 1.18 | 1.1 | 0.08 | 13.8 | 867 | 600 | 267 | 115 | 10 | 10 | 15 | 10 | — | — | 30 |
| 18 | 98.76 | 1.23 | 1.2 | 0.03 | 40.0 | 12 | 10 | 2 | 115 | — | 5 | 15 | 10 | — | — | 30 |
| 19 | 98.66 | 1.32 | 1.3 | 0.02 | 65.0 | 23 | 10 | 13 | 170 | 15 | 15 | 30 | 10 | — | 5 | 30 |
| 20 | 98.40 | 1.5 | 1.2 | 0.3 | 4.0 | 789 | 700 | 89 | 173 | 18 | 15 | 30 | 10 | — | 5 | 30 |

| COMPARATIVE EXAMPLE No. | DETAILS | | | | ORIENTATION INDEX | | AREA RATIO OF PRECIPITATED PARTICLES PERCENTAGE % | WIRE EVALUATION | | | OVERALL EVALUATION |
|---|---|---|---|---|---|---|---|---|---|---|---|
| | Zr | W | Sc | OTHERS | 111 | 200 | | LIFE | TOOL | HEAT GENER-ATION | |
| 7 | 5 | — | 20 | 10 | 1.3 | 0.23 | 2.34 | S | C | C | POOR |
| 8 | 5 | — | 20 | 10 | 1.35 | 0.43 | 2.21 | A | C | C | POOR |
| 9 | 5 | — | 20 | 10 | 1.44 | 0.34 | 0.03 | C | S | A | POOR |
| 10 | — | — | 20 | 10 | 1.42 | 0.24 | 2.23 | S | C | C | POOR |
| 11 | — | — | 20 | 10 | 0.2 | 0.22 | 0.91 | C | A | A | POOR |
| 12 | — | — | 20 | 10 | 0.61 | 0.39 | 0.12 | C | S | S | POOR |

TABLE 17-continued

| | | | | | | | | | | | | |
|---|---|---|---|---|---|---|---|---|---|---|---|---|
| 13 | — | — | 20 | 10 | 0.62 | 0.27 | 2.2 | C | C | C | POOR |
| 14 | — | — | 20 | 10 | 0.52 | 0.22 | 0.52 | C | S | S | POOR |
| 15 | — | — | 20 | 10 | 0.97 | 0.32 | 2.6 | C | C | C | POOR |
| 16 | — | — | 20 | 10 | 0.9 | 0.35 | 0.89 | C | A | B | POOR |
| 17 | 10 | — | 20 | 10 | 0.89 | 0.37 | 2.37 | C | C | C | POOR |
| 18 | 10 | 15 | 20 | 10 | 1.44 | 1.2 | 2.4 | A | C | C | POOR |
| 19 | 15 | 20 | 20 | 10 | 0.71 | 2.21 | 2.61 | C | C | C | POOR |
| 20 | 15 | 20 | 20 | 10 | 0.6 | 1.8 | 2.89 | C | C | C | POOR |

TABLE 18

| COMPARATIVE EXAMPLE No. | Al (MASS %) | Fe + Si (MASS %) | DETAILS | | Fe/Si MASS RATIO | Ga + V (MASS ppm) | DETAILS | | TRACE ELEMENTS (MASS ppm) | DETAILS | | | | | | |
|---|---|---|---|---|---|---|---|---|---|---|---|---|---|---|---|---|
| | | | Fe | Si | | | Ga | V | | Mg | Cu | Ni | Zn | Cr | Mn | Ti |
| 21 | 99.95 | 0.006 | 0.005 | 0.001 | 5.0 | 278 | 150 | 128 | 181 | 21 | 15 | 30 | 10 | 5 | 5 | 30 |
| 22 | 98.86 | 1.12 | 1.11 | 0.01 | 111.0 | 19 | 10 | 9 | 150 | 30 | 5 | — | 10 | 5 | 5 | 30 |
| 23 | 99.89 | 0.008 | 0.003 | 0.005 | 0.6 | 870 | 700 | 170 | 132 | 32 | 5 | — | 10 | 5 | 5 | 30 |
| 24 | 99.54 | 0.45 | 0.4 | 0.05 | 8.0 | — | — | — | 150 | 35 | 5 | — | 10 | 10 | 5 | 30 |
| 25 | 98.69 | 1.29 | 1.2 | 0.09 | 13.3 | 40 | 10 | 30 | 142 | 32 | 5 | — | 10 | 10 | — | 30 |
| 26 | 98.90 | 1.08 | 1.04 | 0.04 | 26.0 | 31 | 20 | 11 | 145 | 10 | 5 | 10 | 10 | 10 | — | 30 |
| 27 | 99.50 | 0.48 | 0.4 | 0.08 | 5.0 | 124 | 100 | 24 | 115 | 30 | — | 10 | 5 | 10 | 10 | 10 |
| 28 | 98.46 | 1.5 | 1.4 | 0.1 | 14.0 | 287 | 160 | 127 | 90 | 10 | — | 10 | 5 | 10 | 10 | 5 |
| 29 | 98.75 | 1.23 | 1.2 | 0.03 | 40.0 | 47 | 30 | 17 | 110 | 30 | — | 10 | — | 10 | 10 | 5 |
| 30 | 98.62 | 1.33 | 1.3 | 0.03 | 43.3 | 355 | 300 | 55 | 145 | 40 | 10 | 10 | 10 | 10 | 10 | 10 |
| 31 | 99.42 | 0.48 | 0.43 | 0.05 | 8.6 | 865 | 750 | 115 | 90 | 25 | 10 | 10 | 10 | — | 10 | — |
| 32 | 98.55 | 1.38 | 1.35 | 0.01 | 135.0 | 810 | 750 | 60 | 90 | 25 | 10 | 10 | 10 | — | 10 | — |
| 33 | 99.88 | 0.09 | 0.05 | 0.04 | 1.3 | 150 | 100 | 50 | 139 | 19 | 5 | 5 | 10 | 10 | 5 | 30 |
| 34 | 98.88 | 1.1 | 0.6 | 0.5 | 1.2 | 100 | 50 | 50 | 105 | 25 | 10 | 10 | 5 | 5 | 5 | 10 |
| 35 | 99.07 | 0.9 | 0.8 | 0.1 | 8.0 | 200 | 100 | 100 | 150 | 20 | 5 | 5 | 5 | 5 | 10 | 30 |
| 38 | 99.97 | 0.02 | 0.01 | 0.01 | 1.0 | 50 | 30 | 20 | 75 | 10 | 5 | 5 | 5 | 5 | 5 | 5 |

| COMPARATIVE EXAMPLE No. | DETAILS | | | | ORIENTATION INDEX | | AREA RATIO OF PRECIPITATED PARTICLES PERCENTAGE % | WIRE EVALUATION | | | OVERALL EVALUATION |
|---|---|---|---|---|---|---|---|---|---|---|---|
| | Zr | W | Sc | OTHERS | 111 | 200 | | LIFE | TOOL | HEAT GENERATION | |
| 21 | 15 | 20 | 20 | 10 | 1.26 | 0.22 | 0.01 | C | S | S | POOR |
| 22 | 15 | 20 | 20 | 10 | 1.3 | 0.37 | 2.2 | A | C | C | POOR |
| 23 | 15 | — | 20 | 10 | 1.32 | 0.47 | 0.01 | C | S | A | POOR |
| 24 | 15 | — | 20 | 20 | 0.77 | 0.22 | 0.87 | C | A | S | POOR |
| 25 | 15 | — | 20 | 20 | 0.92 | 0.26 | 2.5 | C | C | C | POOR |
| 26 | — | 30 | 20 | 20 | 0.82 | 2.2 | 2.11 | C | C | C | POOR |
| 27 | — | 10 | 10 | 20 | 0.61 | 0.24 | 0.98 | C | A | A | POOR |
| 28 | — | 10 | 10 | 20 | 0.71 | 0.33 | 2.97 | C | C | C | POOR |
| 29 | 5 | 10 | 10 | 20 | 1.46 | 0.35 | 2.45 | A | C | C | POOR |
| 30 | 5 | 10 | 10 | 20 | 0.82 | 0.4 | 2.65 | C | C | C | POOR |
| 31 | 5 | 10 | — | 10 | 0.82 | 0.22 | 0.95 | C | A | B | POOR |
| 32 | 5 | 10 | — | 10 | 0.93 | 0.4 | 2.7 | C | C | C | POOR |
| 33 | — | 15 | 20 | 20 | 1.34 | 1.23 | 0.17 | C | S | S | POOR |
| 34 | — | 15 | 10 | 10 | 1.23 | 0.95 | 1.9 | C | S | S | POOR |
| 35 | 10 | 20 | 20 | 20 | 1.33 | 0.82 | 2.1 | A | C | C | POOR |
| 38 | 5 | 20 | 5 | 5 | 1.1 | 0.92 | 0.01 | C | S | S | POOR |

None of the aluminum wires of the comparative examples shown in Tables 15, 17, and 18 passed in all of the evaluations and was graded poor in the overall evaluation. In addition, the range of the variations of each data was narrow, and the variations depending on the measurement part were small. That is, this suggests that measurement data of any cross-section perpendicular to the wire axial direction may be considered as a value indicating the entire wire.

From the above, by controlling the orientation index and the area ratio of the precipitated particles, the aluminum wire for a power semiconductor according to the embodiment could simultaneously solve an object of having followability for lateral bending and causing no wire detachment from a wedge tool and an object of achieving a long life in a power cycle test.

The aluminum wire for a power semiconductor according to the present invention can greatly contribute to the development of the power electronics industry, the automobile industry, the electric railroads, the electric power industry, and the like.

The invention claimed is:

1. An aluminum wire comprising an aluminum alloy having an aluminum purity of 99 mass % or more,
    the aluminum wire containing, relative to a total amount of the aluminum alloy, a total of 0.01 mass % or more and 1 mass % or less of iron and silicon,
    wherein in a lateral cross-section in a direction perpendicular to a wire axis of the aluminum wire, an orientation index of (111) is 1 or more, an orientation index of (200) is 1 or less, and an area ratio of precipitated particles to the lateral cross-section in the direction perpendicular to the wire axis is 0.02% or more and 2% or less.

2. The aluminum wire according to claim 1, wherein the aluminum alloy contains a total of 0.1 mass % or more and 1 mass % or less of iron and silicon relative to the total amount, and an area ratio of the precipitated particles is 0.1% or more and 2% or less.

3. The aluminum wire according to claim 1, further containing, relative to the total amount of the aluminum alloy, a total of 50 mass ppm or more and 800 mass ppm or less of at least one element of gallium and vanadium.

4. The aluminum wire according to any one of claim 1, wherein a residual resistance ratio represented by the following formula is 10 or more, Residual resistance ratio=(electric resistance at room temperature of 300 K/(electric resistance in liquid helium at 4.2 K)    (1)

5. The aluminum wire according to any one of claim 1, wherein an area ratio of the precipitated particles is 0.2% or more and 1.8% or less.

6. The aluminum wire according to any one of claim 1, wherein an aluminum purity of the aluminum alloy is 99.9 mass % or less.

7. The aluminum wire according to any one of claim 1, wherein an orientation index of the (111) is 1.3 or more.

8. The aluminum wire according to any one of claim 1, wherein an orientation index of the (200) is 0.6 or less.

9. The aluminum wire according to any one of claim 1, wherein a content ratio of iron and silicon in the aluminum alloy is 0.3 or more and 90 or less by mass ratio represented by iron/silicon.

10. The aluminum wire according to any one of claim 1, wherein a wire diameter thereof is 40 μm or more and 700 μm or less.

11. An aluminum wire manufacturing method comprising:
    a step of preparing an aluminum alloy material, the aluminum alloy material being an aluminum alloy having an aluminum purity of 99 mass % or more and containing, relative to a total amount of the aluminum alloy, a total of 0.01 mass % or more and 1 mass % or less of iron and silicon; and
    a step of performing wire drawing on the aluminum alloy material,
    wherein in a lateral cross-section in a direction perpendicular to a wire axis of the aluminum wire, an orientation index of (111) is 1 or more, an orientation index of (200) is 1 or less, and an area ratio of precipitated particles to the lateral cross-section in the direction perpendicular to the wire axis is 0.02% or more and 2% or less.

12. The aluminum wire manufacturing method according to claim 11,
    wherein the step of performing wire drawing comprises:
    an intermediate wire drawing step of obtaining an intermediate wire rod by performing wire drawing on the aluminum alloy material so as to have a wire diameter of 7 to times or more to 130 times or less a final wire diameter thereof;
    an intermediate heat treatment in which the intermediate wire rod is heated at 400° C. or more to 560° C. or less for 60 minutes or more to 420 minutes or less;
    a solution treatment step in which the intermediate wire rod is quenched at a quenching of 20° C./second or more and 300° C./second or less;
    a final wire drawing step of performing wire drawing so as to obtain a final wire diameter of 40 μm or more and 700 μm or less; and
    a final heat treatment of performing a batch heat treatment at 200° C. or more and 340° C. or less.

13. A semiconductor device comprising:
    a semiconductor element having an electrode; and
    an aluminum wire connected to the electrode,
    the aluminum wire comprising an aluminum alloy having an aluminum purity of mass % or more, and the aluminum wire containing, relative to a total amount of the aluminum alloy, a total of 0.01 mass % or more and 1 mass % or less of iron and silicon,
    wherein in a lateral cross-section in a direction perpendicular to a wire axis of the aluminum wire, an orientation index of (111) is 1 or more, an orientation index of (200) is 1 or less, and an area ratio of precipitated particles to the lateral cross-section in the direction perpendicular to the wire axis is 0.02% or more and 2% or less.

* * * * *